US012237862B2

(12) United States Patent
Luo

(10) Patent No.: US 12,237,862 B2
(45) Date of Patent: *Feb. 25, 2025

(54) MIXING COEFFICIENT DATA FOR PROCESSING MODE SELECTION

(71) Applicant: MICRON TECHNOLOGY, INC., Boise, ID (US)

(72) Inventor: Fa-Long Luo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/053,310

(22) Filed: Nov. 7, 2022

(65) Prior Publication Data

US 2023/0113600 A1    Apr. 13, 2023

Related U.S. Application Data

(63) Continuation of application No. 17/150,016, filed on Jan. 15, 2021, now Pat. No. 11,528,048, which is a
(Continued)

(51) Int. Cl.
*H04B 1/40* (2015.01)
*G06N 3/044* (2023.01)
(Continued)

(52) U.S. Cl.
CPC ............. *H04B 1/401* (2013.01); *G06N 3/044* (2023.01); *G06N 3/08* (2013.01); *H04B 1/44* (2013.01);
(Continued)

(58) Field of Classification Search
CPC ........ H04B 1/401; H04B 1/44; H04B 7/0851; G06N 3/0445; G06N 3/08; G06N 20/00;
(Continued)

(56) References Cited

U.S. PATENT DOCUMENTS

| 5,532,950 A | 7/1996 | Moses et al. |
| 5,712,922 A | 1/1998 | Loewenthal et al. |

(Continued)

FOREIGN PATENT DOCUMENTS

| CN | 1555608 A | 12/2004 |
| CN | 1722723 A | 1/2006 |

(Continued)

OTHER PUBLICATIONS

Ma, Yongtao , "Research On the Neural Networks Optimization Technique for Communication Channel Modeling", Full text Database of Chinese Doctoral Dissertations: www.cnki.net; Dec. 2010; pp. all.

(Continued)

*Primary Examiner* — Siu M Lee
(74) *Attorney, Agent, or Firm* — Dorsey & Whitney LLP

(57) ABSTRACT

Examples described herein include systems and methods which include wireless devices and systems with examples of mixing input data delayed versions of at least a portion of the respective processing results with coefficient data specific to a processing mode selection. For example, a computing system with processing units may mix the input data delayed versions of respective outputs of various layers of multiplication/accumulation processing units (MAC units) for a transmission in a radio frequency (RF) wireless domain with the coefficient data to generate output data that is representative of the transmission being processed according to a wireless processing mode selection. In another example, such mixing input data with delayed versions of processing results may be to receive and process noisy wireless input data. Examples of systems and methods described herein may facilitate the processing of data for 5G wireless communications in a power-efficient and time-efficient manner.

16 Claims, 15 Drawing Sheets

Related U.S. Application Data continuation of application No. 16/683,223, filed on Nov. 13, 2019, now Pat. No. 10,924,152.

(51) Int. Cl.
| | |
|---|---|
| *G06N 3/08* | (2023.01) |
| *H04B 1/401* | (2015.01) |
| *H04B 1/44* | (2006.01) |
| *H04B 7/08* | (2006.01) |
| *H04L 1/00* | (2006.01) |
| *H04L 25/02* | (2006.01) |
| *H04W 72/044* | (2023.01) |

(52) U.S. Cl.
CPC ......... *H04B 7/0851* (2013.01); *H04L 1/0052* (2013.01); *H04L 25/0204* (2013.01); *H04W 72/044* (2013.01)

(58) Field of Classification Search
CPC ............... H04L 1/0052; H04L 25/0204; H04L 25/03165; H04W 72/044; H03M 13/1102; H03M 13/27; H03M 13/2957; H03M 13/6597
See application file for complete search history.

(56) References Cited

U.S. PATENT DOCUMENTS

| | | | |
|---|---|---|---|
| 6,490,269 B1 | 12/2002 | Yamaura | |
| 8,773,969 B1 | 7/2014 | Zhang et al. | |
| 8,867,633 B2 | 10/2014 | Suehiro | |
| 9,088,168 B2 | 7/2015 | Mach et al. | |
| 9,942,074 B1 | 4/2018 | Luo et al. | |
| 10,027,523 B2* | 7/2018 | Chritz ................. | H04B 1/0039 |
| 10,439,855 B2* | 10/2019 | Chritz ................. | H04B 1/0039 |
| 10,484,225 B2* | 11/2019 | Luo ..................... | H04L 27/2628 |
| 10,886,998 B2* | 1/2021 | Luo ..................... | H04B 1/0003 |
| 10,924,152 B1* | 2/2021 | Luo ..................... | H03M 13/6597 |
| 10,979,097 B2* | 4/2021 | Luo ..................... | H04L 5/1461 |
| 11,088,888 B2 | 8/2021 | Luo et al. | |
| 11,115,256 B2 | 9/2021 | Chritz et al. | |
| 11,258,473 B2* | 2/2022 | Luo ..................... | G06N 3/08 |
| 11,424,764 B2* | 8/2022 | Luo ..................... | H03M 13/6597 |
| 11,528,048 B2* | 12/2022 | Luo ..................... | H04B 1/406 |
| 11,569,851 B2* | 1/2023 | Luo ..................... | H04B 7/0413 |
| 11,658,687 B2 | 5/2023 | Chritz et al. | |
| 11,671,291 B2 | 6/2023 | Luo | |
| 11,695,503 B2 | 7/2023 | Luo et al. | |
| 11,755,408 B2* | 9/2023 | Luo ..................... | G06N 3/045 |
| | | | 714/764 |
| 11,838,046 B2* | 12/2023 | Luo ..................... | H04L 5/1461 |
| 2001/0024447 A1 | 9/2001 | Yoshio et al. | |
| 2003/0120363 A1 | 6/2003 | Luo et al. | |
| 2003/0144827 A1 | 7/2003 | Yang | |
| 2004/0120421 A1 | 6/2004 | Filipovic | |
| 2004/0218683 A1 | 11/2004 | Batra et al. | |
| 2005/0141632 A1 | 6/2005 | Choi et al. | |
| 2005/0198472 A1 | 9/2005 | Sih et al. | |
| 2006/0098605 A1 | 5/2006 | Li | |
| 2006/0227736 A1 | 10/2006 | Conyers et al. | |
| 2007/0274324 A1 | 11/2007 | Wu et al. | |
| 2008/0004078 A1 | 1/2008 | Barratt et al. | |
| 2008/0165891 A1 | 7/2008 | Budianu et al. | |
| 2009/0054999 A1 | 2/2009 | Batruni | |
| 2009/0082017 A1 | 3/2009 | Chang et al. | |
| 2010/0303451 A1 | 12/2010 | Nakabayashi | |
| 2012/0076234 A1 | 3/2012 | Kim et al. | |
| 2012/0176966 A1 | 7/2012 | Ling | |
| 2012/0252372 A1 | 10/2012 | Kihara et al. | |
| 2013/0006601 A1 | 1/2013 | Mlinarsky et al. | |
| 2013/0022128 A1 | 1/2013 | Symes | |
| 2013/0042143 A1 | 2/2013 | Melzer et al. | |
| 2014/0195779 A1 | 7/2014 | Nicol et al. | |
| 2014/0307760 A1 | 10/2014 | Sorrells et al. | |
| 2015/0098535 A1 | 4/2015 | Wu et al. | |
| 2015/0289292 A1 | 10/2015 | Sun et al. | |
| 2015/0349725 A1 | 12/2015 | Hirai et al. | |
| 2016/0028514 A1 | 1/2016 | Venkataraghavan et al. | |
| 2018/0059215 A1 | 3/2018 | Turbiner et al. | |
| 2018/0059218 A1 | 3/2018 | Buettgen et al. | |
| 2018/0152330 A1 | 5/2018 | Chritz et al. | |
| 2018/0227158 A1 | 8/2018 | Luo et al. | |
| 2018/0255552 A1* | 9/2018 | Luo ................. | H04W 72/0453 |
| 2018/0285715 A1 | 10/2018 | Son et al. | |
| 2018/0322388 A1 | 11/2018 | O'Shea | |
| 2018/0324021 A1 | 11/2018 | Chritz et al. | |
| 2019/0280900 A1 | 9/2019 | Kurras et al. | |
| 2019/0326924 A1 | 10/2019 | Tanio | |
| 2020/0036567 A1 | 1/2020 | Chritz et al. | |
| 2020/0044905 A1 | 2/2020 | Luo et al. | |
| 2020/0073636 A1 | 3/2020 | Cammarota et al. | |
| 2020/0274608 A1 | 8/2020 | Luo et al. | |
| 2020/0327185 A1 | 10/2020 | Xu | |
| 2021/0119690 A1 | 4/2021 | Luo et al. | |
| 2021/0143860 A1 | 5/2021 | Luo | |
| 2021/0367822 A1 | 11/2021 | Chritz et al. | |
| 2021/0367823 A1 | 11/2021 | Luo et al. | |
| 2022/0140850 A1* | 5/2022 | Luo ....................... | H04B 1/525 |
| | | | 455/298 |
| 2023/0115877 A1* | 4/2023 | Luo ..................... | G06F 11/1068 |
| | | | 714/764 |
| 2023/0261915 A1 | 8/2023 | Luo | |
| 2023/0283405 A1 | 9/2023 | Luo et al. | |

FOREIGN PATENT DOCUMENTS

| | | |
|---|---|---|
| CN | 1900927 A | 1/2007 |
| CN | 101175061 A | 5/2008 |
| CN | 101243423 A | 8/2008 |
| CN | 101578836 A | 11/2009 |
| CN | 101652947 A | 2/2010 |
| CN | 102474489 A | 5/2012 |
| CN | 202218240 U | 5/2012 |
| CN | 102541015 A | 7/2012 |
| CN | 102665229 A | 9/2012 |
| CN | 102739832 A | 10/2012 |
| CN | 108694692 A | 10/2018 |
| CN | 109754790 A | 5/2019 |
| CN | 110024345 A | 7/2019 |
| CN | 110036611 A | 7/2019 |
| CN | 110383720 A | 10/2019 |
| EP | 2374251 B1 | 6/2015 |
| JP | 2005236852 A | 9/2005 |
| JP | 4331580 B2 | 6/2009 |
| JP | 2017016384 A | 1/2017 |
| WO | 02058290 A1 | 7/2002 |
| WO | 2006052501 A1 | 5/2006 |
| WO | 2018101994 A1 | 6/2018 |
| WO | 2018101997 A | 6/2018 |
| WO | 2020172060 A1 | 2/2020 |
| WO | 2021096640 A | 5/2021 |

OTHER PUBLICATIONS

Vinutha, C.B., et al., "Energy Efficient Wireless Sensor Network Using Neural Network Based Smart Sampling and Reliable Routing Protocol", IEEE: International Conference on Wireless Communications, Signal Processing and Networking, Mar. 2017, 5 pgs.

Wang, Youjun, "Signal Recognition Technology Based Neural Network in Wireless Communications", Institution of Information Engineering: University of Chinese Academy of Sciences, Jun. 2018, 73 pgs.

U.S. Appl. No. 18/136,919, filed Apr. 20, 2023, titled, "Mixing Coefficient Data Specific to a Processing Mode Selection Using Layers of Multiplication/Accumulation Units for Wireless Communication,"; pp. all pages of application as filed.

U.S. Appl. No. 17/394,601 titled "Wireless Devices and Systems Including Examples of Mixing Coefficient Data Specific to a Processing Mode Selection" filed Aug. 5, 2021, pp. all pages of application as filed.

(56) References Cited

OTHER PUBLICATIONS

U.S. Appl. No. 17/394,597 titled "Wireless Devices and Systems Including Examples of Mixing Input Data With Coefficient Data" filed Aug. 5, 2021, pp. all pages of application as filed.
U.S. Appl. No. 16/594,550 titled "Wireless Devices and Systems Including Examples of Mixing Input Data With Coefficient Data" filed Oct. 7, 2019, pp. all pages of application as filed.
U.S. Appl. No. 16/594,503 titled "Wireless Devices and Systems Including Examples of Mixing Coefficient Data Specific to a Processing Mode Selection" filed Oct. 7, 2019, pp. all pages of application as filed.
U.S. Appl. No. 17/150,016 titled "Mixing Coefficient Data for Processing Mode Selection" filed Jan. 15, 2021, pp. all pages of application as filed.
ISR/WO dated Jan. 29, 2021 for PCT Application No. PCT/US2020/056146; pp. all.
U.S. Appl. No. 16/683,223, titled "Mixing Coefficient Data for Processing Mode Selection", filed Nov. 13, 2019, pp. all pages of application as filed.
U.S. Appl. No. 15/365,397 entitled "Wireless Devices and Systems Including Examples of Mixing Coefficient Data Specific to a Processing Mode Selection", filed Nov. 30, 2016, pp. all pages of application as filed.
U.S. Appl. No. 15/941,532 titled "Wireless Devices and Systems Including Examples of Mixing Coefficient Data Specific to a Processing Mode Selection", filed Mar. 30, 2018, pp. all pages of application as filed.
U.S. Appl. No. 16/034,751 titled "Wireless Devices and Systems Including Examples of Mixing Input Data With Coefficient Data" filed Jul. 13, 2018, pp. all pages of application as filed.
U.S. Appl. No. 16/282,916 titled "Mixing Coefficient Data Specific to a Processing Mode Selection Using Layers of Multiplication/Accumulation Units for Wireless Communication" filed Feb. 22, 2019, pp. all pages of application as filed.
U.S. Appl. No. 17/138,299, titled "Mixing Coefficient Data Specific to a Processing Mode Selection Using Layers of Multiplication/Accumulation Units for Wireless Communication", filed Dec. 30, 2020, pp. all pages of application as filed.
U.S. Appl. No. 15/365,326 entitled "Wireless Devices and Systems Including Examples of Mixing Input Data With Coefficient Data", filed Nov. 30, 2016, pp. all pages of application as filed.
Helmschmidt, Jurgen et al., "Reconfigurable Signal Processing in Wireless Terminals", Proceedings of the Design, Automation and Test in Europe Conference and Exhibition, IEEE Computer Society, Mar. 2003, 6 pgs.
Helmschmidt, Jurgen et al., "Reconfigurable Signal Processing in Wireless Terminals [Mobile Applications]", Design, Automation and Test in Europe Conference and Exhibition, Conference Paper, Feb. 2003, pp. all.
Luo, et al., Signal Processing for 5G: Algorithms and Implementations, IEEE—WILEY; Oct. 2016, pp. 431-455.
Rauwerda, Gerald et al., "Towards Softward Defined Radios Using Coarse-Grained Reconfigurable Hardware", IEEE Transactions on Very Large Scale Integration Systems, vol. 16, No. 1, Jan. 2008, 11 pgs.
Shixian, Wang , "Research On Digital Signal Processor Architecture Technology for Cognitive Radio", China PhD Dissertation Full Text Database (Electronic Journal) Information Science and Technology Series, Oct. 31, 2014, pp. all.
Rauwerda , et al., "Towards Software Defined Radios Using Coarse-Grained Reconfigurable Hardward", IEEE Transactions on Very Large Scale Integration (VLSI Systems), vol. 16, No. 1, Jan. 2008, 11 pgs.

\* cited by examiner

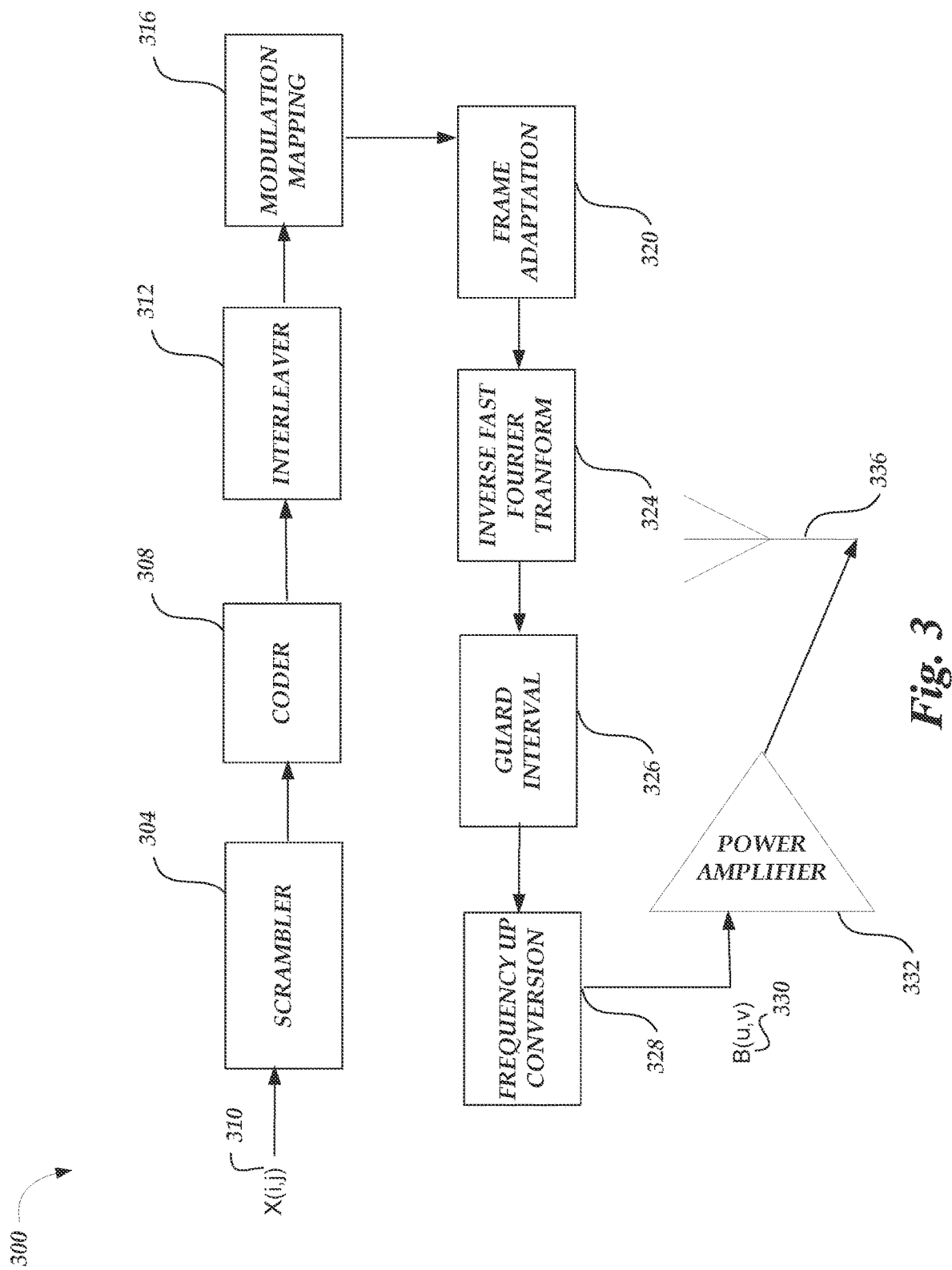

MIXING COEFFICIENT DATA FOR PROCESSING MODE SELECTION

REFERENCE TO RELATED APPLICATION(S)

This application is a continuation of U.S. patent application Ser. No. 17/150,016 filed Jan. 15, 2021 and issued as U.S. Pat. No. 11,528,048 on Dec. 13, 2022, which is a continuation of U.S. patent application Ser. No. 16/683,223 filed Nov. 13, 2019 and issued as U.S. Pat. No. 10,924,152 on Feb. 16, 2021. The aforementioned applications, and issued patents, are incorporated herein by reference, in their entirety, for any purpose.

BACKGROUND

Digital signal processing for wireless communications, such as digital baseband processing or digital front-end implementations, can be implemented using some hardware (e.g. silicon) computing platforms. For example, multimedia processing and digital radio frequency (RF) processing may be accomplished in a digital front-end implementation of a wireless transceiver, as implemented by an application-specific integrated circuit (ASIC). A variety of hardware platforms can implement such digital signal processing, such as the ASIC, a digital signal processor (DSP) implemented as part of a field-programmable gate array (FPGA), or a system-on-chip (SoC). However, each of these solutions often requires implementing customized signal processing methods that are hardware implementation specific. For example, a digital signal processor can implement a Turbo coding application for data in a customized design of an FPGA.

Moreover, there is interest in moving wireless communications to "fifth generation" (5G) systems. 5G offers promise of increased speed and ubiquity, but methodologies for processing 5G wireless communications have not yet been fully set.

BRIEF DESCRIPTION OF THE DRAWINGS

FIG. 3 is a schematic illustration of a wireless transmitter.

DETAILED DESCRIPTION

Figure 1A:
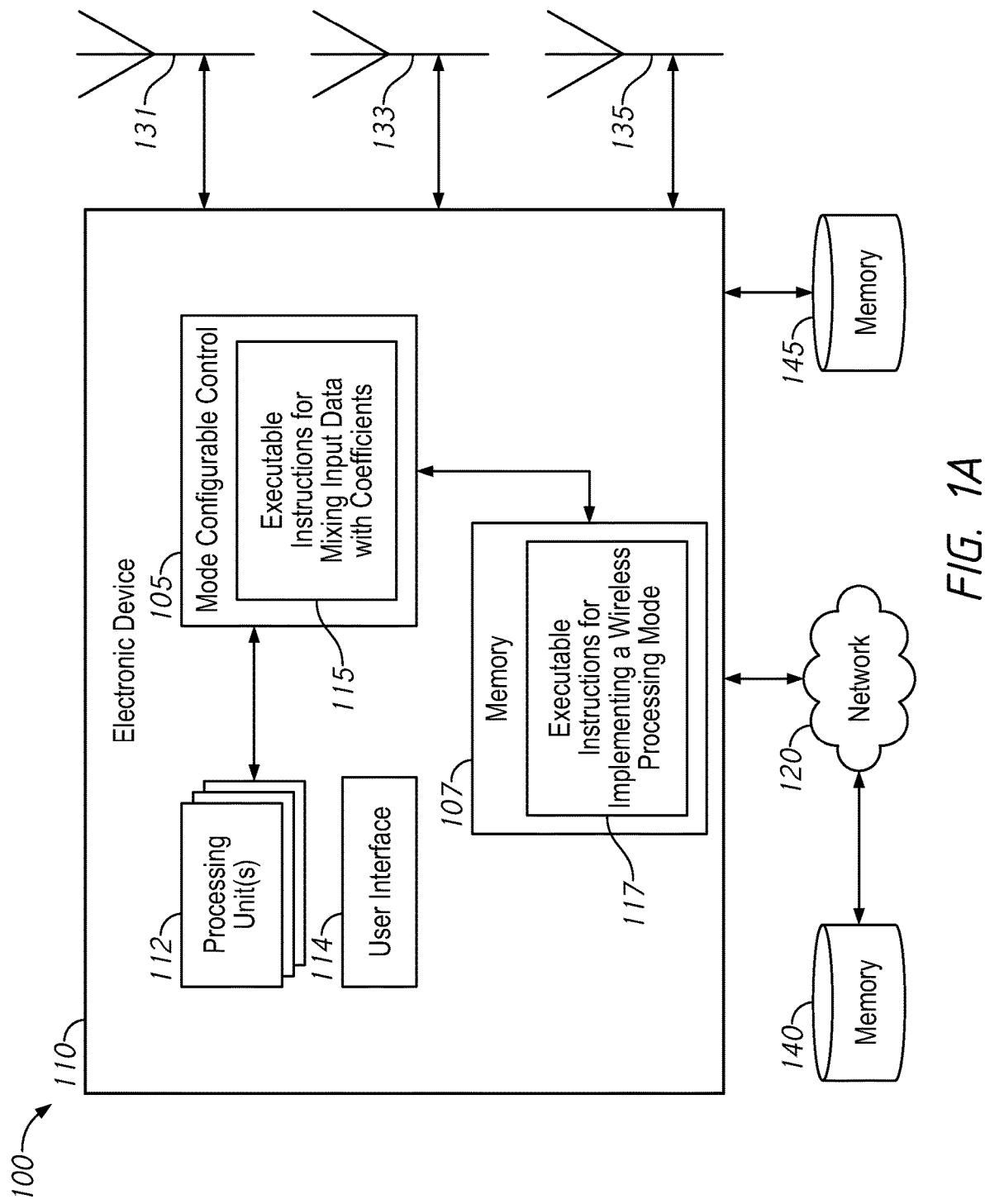
FIG. 1A is a schematic illustration of a computing system arranged in accordance with examples described herein.

There is interest in moving wireless communications to "fifth generation" (5G) systems. 5G offers promise of increased speed and ubiquity, but methodologies for processing 5G wireless communications have not yet been set. The lead time in designing and processing a hardware platform for wireless communications can be significant. Accordingly, it may be advantageous in some examples to design and/or process a hardware platform for 5G wireless communication that may process wireless communications using a configurable algorithm— in this manner the algorithm utilized by the hardware platform may not need to be decided until after the platform is designed and/or fabricated.

Examples described herein include systems and methods which include wireless devices and systems with examples of mixing input data with coefficient data. The input data may be any data that is input for digital signal processing. The coefficient data may be any data that is specific to a wireless protocol. Examples of wireless protocols include, but are not limited to a 5G wireless system utilizing a wireless protocol such as filter bank multi-carrier (FBMC), the generalized frequency division multiplexing (GFDM), universal filtered multi-carrier (UFMC) transmission, bi-orthogonal frequency division multiplexing (BFDM), sparse code multiple access (SCMA), non-orthogonal multiple access (NOMA), multi-user shared access (MUSA) and faster-than-Nyquist (FTN) signaling with time-frequency packing. Generally, any wireless protocol including any 5G wireless protocol may be represented by coefficient data as disclosed herein. The input data may be mixed with the coefficient data to generate output data. For example, a computing system with processing units may mix the input data for a transmission in a radio frequency (RF) wireless domain with the coefficient data to generate output data that is representative of the transmission being processed according to the wireless protocol in the RF wireless domain. In some examples, the computing system generates an approximation of output data. For example, the output data may be an approximation of output data generated when input data is processed in hardware (e.g., an FPGA) specifically-designed to implement the wireless protocol that the coefficients correspond to.

Examples described herein additionally include systems and methods which include wireless devices and systems with examples of mixing input data with such coefficient data in multiple layers of multiplication/accumulation units (MAC units) and corresponding memory look-up units (MLUs). For example, a number of layers of MAC units may correspond to a number of wireless channels, such as a number of channels received at respective antennas of a plurality of antennas. In addition, a number of MAC units and MLUs utilized is associated with the number of channels. For example, a second layer of MAC units and MLUs may include m-1 MAC units and MLUs, where m represents the number of antennas, each antenna receiving a portion of input data. Advantageously, in utilizing such a hardware framework, the processing capability of generated output data may be maintained while reducing a number of MAC units and MLUs, which are utilized for such processing in an electronic device. In some examples, however, where board space may not be limited, a hardware framework may be utilized that includes m MAC units and m MLUs in each layer, where m represents the number of antennas.

While the above examples of mixing input data with coefficient data has described in terms of an RF wireless domain, it can be appreciated that wireless communication data may be processed from the perspective of different domains, such as a time domain (e.g., time-division multiple access (TDMA)), a frequency domain (e.g., orthogonal frequency-division multiple access (OFDMA), and/or a code domain (e.g., code-division multiple access (CDMA)).

Advantageously in some examples, the systems and methods described herein may operate according to multiple standards and/or with multiple applications, including changes or upgrades to each thereto; in contrast to the inflexible framework of an ASIC-based solution. In some examples, as discussed herein in terms of processing units implementing multiplication, addition, or accumulation functionalities, examples of the systems and methods described herein may operate on a power-efficient framework, consuming minimal power with such functionalities; in contrast to a power-hungry framework of a FPGA/DSP-based solution. In some examples, systems and methods described herein may operate with a substantially integrated framework from a unified programming language perspective; in contrast to the various programming languages needed for integration of a SoC solution that may can pose programming challenges when implementing heterogeneous interfaces for control units, computational units, data units and accelerator units.

Examples described herein include systems and methods which include wireless transmitters and receivers with examples of mixing input data with coefficient data. For example, the digital signal processing aspects of a wireless transmitter may be implemented by mixing input data with coefficient data, as described herein. In this manner, a computing system can output data that is representative of operations of an RF front-end to modulate the input data for a RF wireless transmission. In some examples, the coefficient data can be mixed with the input data to represent certain operations, such as: block coding the input data; interleaving the block coded input data; mapping the block coded data that was interleaved according to a modulation mapping to generate modulated input data; converting the modulated input data to a frequency domain with an inverse fast Fourier transform (IFFT); and mixing the modulated input data that was converted to the frequency domain using a carrier signal, which, in turn, generates output data. A wireless transmitter and/or wireless receiver may be referred to herein as a wireless transceiver.

Examples described herein include systems and methods for training a computing device with coefficient data. In some examples, a wireless transmitter may receive the input associated with a RF wireless transmission. The wireless transmitter may perform operations as an RF front-end, such as modulating the input data for a RF wireless transmission. The output data that is generated by the wireless transmitter may be compared to the input data to generate coefficient data. A computing device that receives and compares that output data, along with other corresponding input data and corresponding, subsequent output data, may be trained to generate coefficient data based on the operations of a specifically-designed wireless transmitter such that mixing arbitrary input data using the coefficient data generates an approximation of the output data, as if it were processed by the specifically-designed wireless transmitter. The coefficient data can also be stored in a coefficient database, with each set of coefficient data corresponding to a wireless protocol that may be utilized in the RF domain for a data transmission.

In some examples, the computing device may receive a processing mode selection, for example, a processing mode selection from a user interacting with the computing system. A processing mode selection can indicate a specific processing mode for the computing system. As described further below, a processing mode may correspond to a single processing mode, a multi-processing mode, or a full processing mode. As an example, a full processing mode may be a processing mode representative of a wireless transmitter (e.g., a wireless transmitter processing mode) or a processing mode representative of a wireless receiver (e.g., a wireless receiver processing mode). For example, a wireless transmitter mode may comprise the operation of an RF front-end. Accordingly, a computing device can provide output data that is representative of the data transmission being processed according to a wireless transmitter mode, when such a processing mode selection is received by the computing device.

Generally, any aspect of a wireless protocol can be used to generate coefficient data, which, in turn, may be utilized to mix input data to generate output data that is representative of that aspect of the wireless protocol being processed in hardware that implements that aspect of the wireless protocol. For example, an FPGA may be used to process an IFFT for various data transmissions to be transmitted according to a wireless protocol that incorporates an IFFT. As disclosed herein, a computing system mixing input data with coefficient data specific to an IFFT operation may be utilized to generate output data that is representative of the IFFT, as if the input data were processed in the aforementioned FPGA configured to process an IFFT. In some examples, the computing system advantageously performs in more versatile setting than an FPGA processing an IFFT. An FPGA implementing an IFFT may be a pre-designed hardware unit that is optimized to perform at a specific setting for the IFFT, for example, a 256-point IFFT setting. Accordingly, the FPGA that is designed for a 256-point IFFT is limited to performing optimally for wireless protocols that specify 256-point IFFTs. However, if a specific implementation of a wireless protocol specifies that a 512-point FFT is to be performed by the FPGA, the FPGA may not perform optimally in that setting. Using examples of the systems and methods described herein, a computing system may advantageously be configured to operate as a 256-point IFFT or a 512-point IFFT, depending on system or user input (e.g., a processing mode selection), thereby allowing the computing system to perform optimally in more settings than an FPGA configured to implement a specific type of IFFT.

While some examples herein have been described in terms of an IFFT, it can be appreciated that various aspects of a wireless protocol can be processed by mixing input data with coefficient data to generate output data representative of that aspect. For example, other aspects of wireless protocols that can be implemented with coefficient data being mixed with input data include, but are not limited to: baseband processing of a wireless transmitter, baseband processing of a wireless receiver, processing of a digital front-end transmitter (e.g., a digital RF transistor), analog-to-digital conversion (ADC) processing, digital-to-analog (DAC) conversion processing, digital up conversion (DUC), digital down conversion (DDC), direct digital synthesizer (DDS) processing, DDC with DC offset compensation, digital pre-distortion (DPD), peak-to-average power ratio (PAPR) determinations, crest factor reduction (CFR) determinations, pulse-shaping, image rejection, delay/gain/imbalance compensation, noise-shaping, numerical controlled oscillator (NCO), self-interference cancellation (SIC), any modulation algorithm, any error-correction coding or decoding algorithm, channel estimation, any pre-coding algorithm, and combinations thereof.

Multi-layer neural networks (NNs) and/or multi-layer recurrent neural networks (RNNs) may be used to transmit or receive wireless input data (e.g., as wireless input data to be transmitted via an antenna or noisy wireless input data received at an antenna). The NNs and/or RNNs may have nonlinear mapping and distributed processing capabilities which may be advantageous in many wireless systems, such as those involved in processing wireless input data having time-varying wireless channels (e.g., autonomous vehicular networks, drone networks, or Internet-of-Things (IoT) networks). In this manner, neural networks and/or recurrent neural networks described herein may be used to implement wireless systems associated with various wireless protocols (e.g., 5G wireless protocols).

FIG. 1A is a schematic illustration of an electronic device 110 arranged in a system 100 in accordance with examples described herein. The electronic device 110 is coupled to a memory 140 via network 120 or memory 145, each of which may store coefficient data. Coefficient data stored in the memory 140 or memory 145 may include coefficient data which may be mixed with input data received by the electronic device 110 in examples described herein. Electronic device 110 also includes processing units 112 that may interact with mode configurable control 105 and memory 107, both of which may be encoded with instructions executable by the processing unit(s) 112. In some implementations, mode configurable control 105 may be implemented as a memory. As used herein, memory may refer to computer readable media, which may include both storage media and communication media. Example computer readable media may include volatile and nonvolatile, removable and non-removable media implemented in any method or technology for storage of information, such as computer readable instructions. The mode configurable control 105 includes the executable instructions 115 for mixing input data with coefficients; and the memory 107 includes the executable instructions 117 for implementing a wireless processing mode. For example, the mode configuration control 105 may be implemented using circuitry (e.g., logic), one or more processor(s), microcontroller(s), controller(s), or other elements. The mode configuration control 105 may select certain weights and/or other parameters (e.g., from memory 145 storing weights) and provide those weights and/or other parameters to one or more of the multiplication/accumulation units and/or memory look-up units of FIGS. 2A-2C. In some examples, weights and/or other parameters stored in the memory 145 may be associated with a certain wireless processing mode. During operation, the mode configuration control 105 may be used to select weights and/or other parameters in memory 145 based on an indicated wireless processing mode, which may be supplied from the memory 107 executing the executable instructions 117 for implementing a wireless processing mode.

The processing unit(s) 112 may be implemented using one or more processors, for example, having any number of cores. In some examples, the processing unit(s) 112 may include circuitry, including custom circuitry, and/or firmware for performing functions described herein. For example, circuitry can include multiplication unit/accumulation units for performing the described functions, as described herein. Processing unit(s) 112 can be any type including but not limited to a microprocessor or a digital signal processor (DSP), or any combination thereof. For example, processing unit(s) 112 can include levels of caching, such as a level one cache and a level two cache, a core, and registers. An example processor core can include an arithmetic logic unit (ALU), a bit manipulation unit, a multiplication unit, an accumulation unit, an adder unit, a look-up table unit, a memory look-up unit, or any combination thereof. Examples of processing unit 112 are described herein, for example with reference to FIG. 2A, 2B, or 2C.

The mode configurable control 105, for example, may be encoded with executable instructions 115 for mixing input data with coefficient data, e.g., to mix input data with coefficient data at the processing units 112. For example, in the context of a 5G wireless transmission system, the executable instructions 115 for mixing input data with coefficient data may include instructions for providing, to the antenna(s) 131, 133, 135, output data that is representative of the input data being processed according to the wireless protocol for that 5G wireless transmission. The executable instructions 115 for mixing input data with coefficient data may further include instructions for multiplying a portion of the input data with coefficient data to generate a coefficient multiplication result and accumulating the coefficient multiplication result to be further multiplied and accumulated with other input data and coefficient data, examples of which are described herein. For example, to generate a coefficient multiplication result, a first layer of multiplication/accumulation processing units (MAC units) may calculate the input data with the plurality of coefficients to generate such coefficient multiplication results, or first processing results of the first layer of MAC units. Continuing in the example, to provide the output data, additional layers of MAC units may calculate the first processing results with additional pluralities of coefficients to generate additional coefficient multiplication results, or second processing results of the additional layers of MAC units. The MLUs of a last layer of the additional layers of MAC units may provide the output data based on the second processing results. Accordingly, the executable instructions 115 for mixing input data with coefficient data may include various sets of executable instructions for different types of hardware implementations, such as those shown in FIGS. 2A-2C, to implement such mixing of input data with coefficient data.

The input data to be mixed may be for transmissions in the RF domain or may be obtained transmission from the RF domain. The electronic device 110 may communication or transceive such transmissions via a plurality of antennas coupled to the electronic device 110. Each antenna 131, 133, and 135 may be associated with a different RF frequency at which it transceives, transmits, or receives RF transmissions. Operating as receiving antennas, the antennas 131, 133, and 135 are coupled to the electronic device 110. Such antennas may obtain RF transmissions that may be provided the processing units 112 to process as input data. For example, each antenna 131, 133, and 135 may represent input data obtained over a corresponding wireless channel, for example, a wireless channel associated with a corresponding frequency of the respective antennas 131, 133, and 135. Accordingly, each RF transmission obtained at the respective antennas 131, 133, and 135 may be referred to as portions of the input data to be mixed. Operating as transmitting antennas, the antennas 131, 133, and 135 may provide output data based on varying portions of input data to be mixed. For example, each portion of input data that was mixed may represent a respective wireless channel, with the output data being provided for transmission at the antennas 131, 133, and 135, as a Multiple-Input Multiple-Output ("MIMO") RF signal. In some implementations, a quantity of additional layers of MAC and MLU units is associated with a quantity of wireless channels.

The memory 107, for example, may be encoded with executable instructions 117 for implementing a wireless processing mode. A processing mode selection may cause the electronic device 110 to receive input data for a transmission based on the processing mode selection. Generally, the electronic device 110 may process input data according to a variety of processing modes. In an example, a multi-processing mode may include at least two aspects of a wireless protocol, whereas a single processing mode includes one aspect of a wireless protocol. Aspects of a wireless protocol may include, among other aspects: fast Fourier transform (FFT) processing, inverse fast Fourier transform (IFFT) processing, coding, Turbo coding, Reed Solomon processing, decoding, interleaving, deinterleaving, modulation mapping, demodulation mapping, scrambling, descrambling, or channel estimation. In some examples, the output data may be formatted such that the output data may be received by another wireless processing unit for further processing. For example, a computing system may operate in single-processing mode as a coding operation to output coded data. Or in a specific example, a computing system may operate in a single-processing as a Turbo coding operation to output turbo coded data. That coded data may be formatted to be received by another wireless processing unit such as interleaving that may be processed differently by the computing system or by another computing system (e.g., a cloud computing system). A processing mode selection may be received via the user interface 114. In some examples, the processing mode selection may be received by decoding and/or examining some portion of incoming input data. For example, the electronic device 110 may recognize that the input data is intended for processing using a particular processing mode, e.g. by recognition of a pattern or other signature indicative of that processing mode in the input data. In some examples, the processing mode selection may also be received from the network 120. The electronic device 110, in receiving an incoming data stream from the network 120, may receive the processing mode selection in that data stream from a control channel or other control plane being implemented at the network 120. For example, the electronic device 110 being implemented as user equipment (UE) may receive Radio Resource Control (RRC) signaling over a control channel from the network 120, where the RRC includes a configuration or flag for a processing mode selection to be implemented by the electronic device 110.

The user interface 114 may be implemented with any of a number of input devices including, but not limited to, a touchscreen, keyboard, mouse, microphone, or combinations thereof. The user interface 114 may receive input from a user, for example, regarding a processing mode selection to specify a processing mode for the processing unit(s) 112. The user interface 114 may communicate the user input to the mode configurable control 105 and memory 107 for processing of the user input. Example user interfaces 114 include a serial interface controller or a parallel interface controller, which may be configured to communicate with external input devices (e.g., keyboard, mouse, pen, voice input device, touch input device, etc.).

The network 120 may include a wired network or direct-wired connection, and wireless media such as acoustic, radio frequency (RF), microwave, infrared (IR) and other wireless media.

The memory(s) 107, 140, and 145 (or mode configurable control 105, if being implemented as a memory) may be implemented using any storage medium accessible to the processing unit(s) 112. For example, RAM, ROM, solid state memory, flash memory, disk drives, system memory, optical storage, or combinations thereof, may be used to implement the mode configurable control or memory(s) 107, 140, and 145. For example, the mode configurable control 105 and memory 107 may store associations between coefficients and wireless protocols and/or processing modes described herein.

The electronic device 110 may be implemented using any of a variety of computing systems, including but not limited to one or more desktop, server, laptop, or other computers. The electronic device 110 generally includes one or more processing unit(s) 112. The computing system 100 may be implemented as a mobile communication device using any user communication device, including but not limited to, a desktop, laptop, cellular phone, tablet, appliance, automobile, or combinations thereof. The electronic device 110 may be programmed with a mobile application (e.g. processing unit(s) 112 and computer readable media encoded with instructions which, when executed, cause the electronic device 110 to perform described functions) for mixing input data with coefficient data or specifying a processing mode. For example, the electronic device 110 may be programmed to receive an indication from a touchscreen of a mobile communication device that a multi-processing mode is to be utilized for data received via a 5G wireless data transmission.

It is to be understood that the arrangement of computing systems of the system 100 may be quite flexible, and although not shown, it is to be understood that the system 100 may include many electronic devices 110, which may be connected via the network 120 can operate in conjunction with each other to perform the systems and methods described herein. The memory 145 and/or the memory 140 may in some examples be implemented using the same media, and in other examples may be implemented using different media. For example, while the memory 140 is shown in FIG. 1A as coupled to the network 120, it can be appreciated that the memory 140 may also be implemented electronic device 110 as part of the mode configurable control 105. Additionally, while a single user interface 114 is shown in FIG. 1A, it can be appreciated that the electronic device 110 may further include any number of input devices, output devices, and/or peripheral components. For example, the user interface 114 may be the interface of a mobile communication device.

Figure 1B:
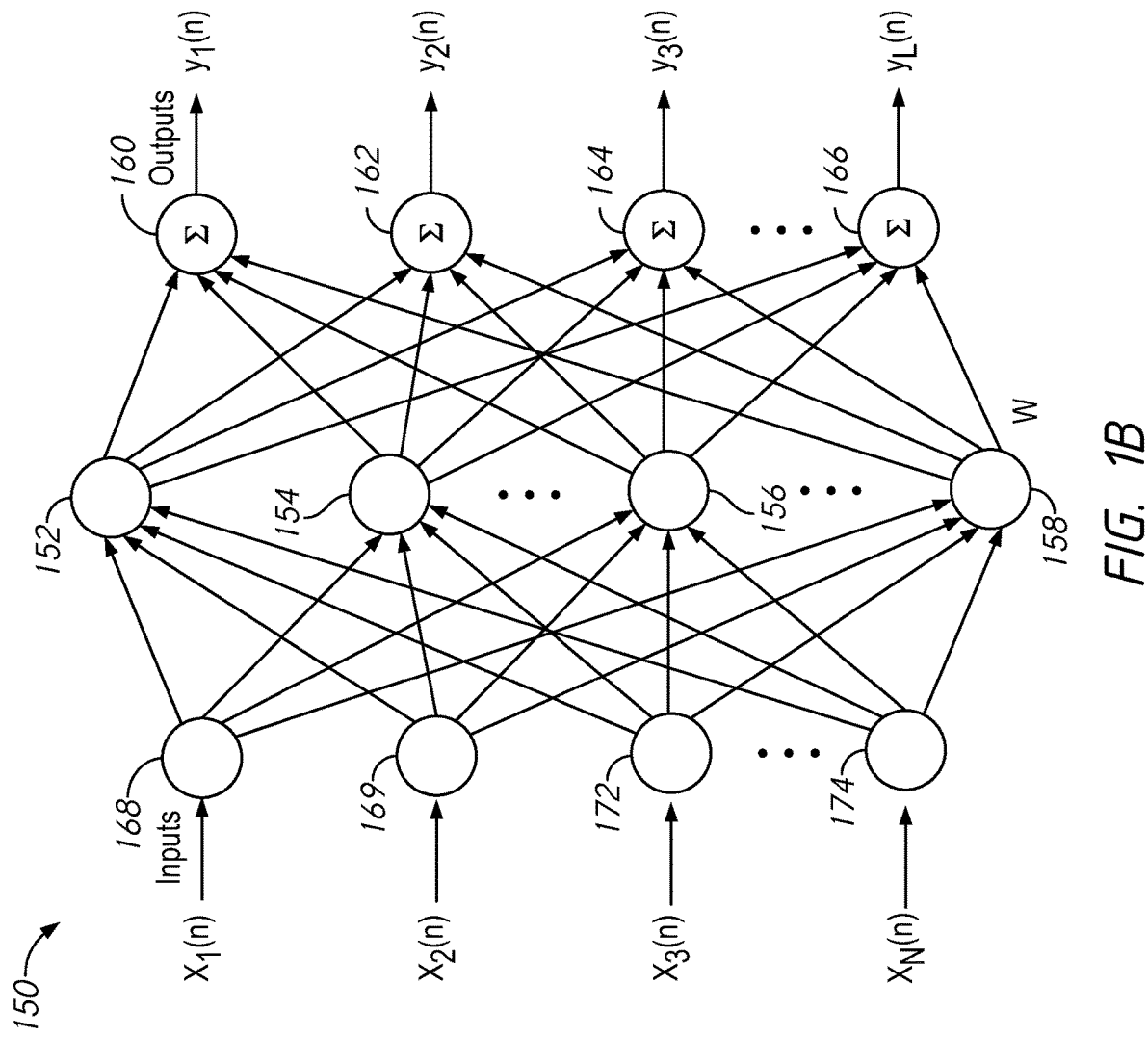
FIG. 1B is a schematic illustration of a neural network arranged in accordance with examples described herein.

FIG. 1B is a schematic illustration of a neural network arranged in accordance with examples described herein. The neural network 150 include three stages (e.g., layers). While three stages are shown in FIG. 1B, any number of stages may be used in other examples. A first stage of neural network 150 includes node 168, node 169, node 172, and node 174. A second stage of neural network 150 includes combiner 152, combiner 154, combiner 156, and combiner 158. A third stage of neural network 150 includes combiner 160, combiner 162, combiner 164, and combiner 166. Additional, fewer, and/or different components may be used in other examples.

Generally, a neural network may be used including multiple stages of nodes. The nodes may be implemented using processing units (e.g., processing units 112) which may execute one or more functions on inputs received from a previous stage and provide the output of the functions to the next stage of the neural network. The processing units may be implemented using, for example, one or more processors, controllers, and/or custom circuitry, such as an application specific integrated circuit (ASIC) and/or a field programmable gate array (FPGA). In some examples, the processing units may be implemented using any combination of one or more processing units described with respect to FIGS. 2A-2C. The processing units may be implemented as combiners and/or summers and/or any other structure for performing functions allocated to the processing unit. In some examples, certain of the elements of neural networks described herein perform weighted sums, e.g., may be implemented using one or more multiplication/accumulation units, which may be implemented using processor(s) and/or other circuitry. In an example, the neural network 150 may be implemented by the electronic device 110.

In the example, of FIG. 1B, the neural network 150 may have an input layer, which may be a first stage of the neural network including node 168, node 169, node 172, and node 174. The nodes node 168, node 169, node 172, and node 174 may implement a linear function which may provide the input signals (e.g., $x1(n)$, $x2(n)$, ... $xm(n)$) to another stage of the neural network (e.g., a 'hidden stage' or 'hidden layer'). Accordingly, in the example of FIG. 1B, m signals of input data may be provided to an input stage (e.g., an input layer) of a neural network during operation. In some examples, the input data may be wireless input data associated with a wireless protocol (e.g., input data to be transmitted as wireless signals in a transmission according to the wireless protocol and/or data received in accordance with a wireless protocol). In some implementations, the input data may also be received wireless signals that is to be processed (e.g., decoded) at the neural network 150, e.g., as the neural network 150 may receive and process received wireless signals as a wireless receiver configured to operate in accordance with a certain wireless protocol. Them signals of input data may be output by the first stage of the neural network 150 to a next stage of the neural network 150. In some examples, the connection between the first stage and the second stage of the neural network 150 may not be weighted—e.g., processing units in the second stage may receive signals unaltered from the first stage in some examples. Each of the input signals may be provided to multiple ones of the processing units in the next stage. While an input layer is shown, in some examples, the input layer may not be present.

The neural network 150 may have a next layer, which may be referred to as a 'hidden layer' in some examples. The next layer may include combiner 152, combiner 154, combiner 156, and combiner 158, although any number of elements may be used. While the processing elements in the second stage of the neural network 150 are referred to as combiners, generally the processing elements in the second stage may perform a nonlinear activation function using the input signals received at the processing element. Any number of nonlinear activation functions may be used. Examples of functions which may be used include Gaussian functions, such as $$f(r) = \exp\left(-\frac{r^2}{\sigma^2}\right).$$

Examples of functions which may be used include multi-quadratic functions, such as $f(r)=(r^2+\sigma^2)^{1/2}$ Examples of functions which may be used include inverse multi-quadratic functions, such as $f(r)=(r^2+\sigma^2)^{-1/2}$. Examples of functions which may be used include thin-plate-spline functions, such as $f(r)=r^2 \log(r)$. Examples of functions which may be used include piece-wise linear functions, such as $f(r)=\frac{1}{2}(|r+1|-|r-1|)$. Examples of functions which may be used include cubic approximation functions, such as $f(r)=1/2(|r^3+1|-|r^3-1|)$. In these example functions, a represents a real parameter (e.g., a scaling parameter) and r is the distance between the input vector and the current vector. The distance may be measured using any of a variety of metrics, including the Euclidean norm.

Each element in the 'hidden layer' may receive as inputs selected signals (e.g., some or all) of the input data. For example, each element in the 'hidden layer' may receive as inputs from the output of multiple selected units (e.g., some or all units) in the input layer. For example, the combiner 152 may receive as inputs the output of node 168, node 169, node 172, and node 174. While a single 'hidden layer' is shown by way of example in FIG. 1B, any number of 'hidden layers' may be present and may be connected in series. While four units are shown in the 'hidden layer', any number may be used, and they may be the same or different in number than the number of nodes in the input layer and/or the number of nodes in any other hidden layer. The nodes in the hidden layer may evaluate at least one non-linear function using combinations of the data received at the hidden layer node (e.g., element). In this manner, the hidden layer may provide intermediate data at an output of one or more hidden layers.

The neural network 150 may have an output layer. The output layer in the example of FIG. 1B may include combiner 160, combiner 162, combiner 164, and combiner 166, although any number of elements may be used. While the processing element in the output stage of the neural network 150 are referred to as combiners, generally the processing elements in the output may perform any combination or other operation using intermediate processing results from a last 'hidden layer' in the neural network. Each element in the output layer may receive as inputs selected intermediate processing results (e.g., some or all) of the data provided by a last 'hidden layer'. For example, the combiner 160 may receive as inputs from the outputs of combiner 152, combiner 154, combiner 156, and combiner 158. The connections between the hidden layer and the output layer may be weighted. For example, a set of weights W may be specified. There may be one weight for each connection between a hidden layer node and an output layer node in some examples. In some examples, there may be one weight for each hidden layer node that may be applied to the data provided by that node to each connected output node. Other distributions of weights may also be used. The weights may be multiplied with the output of the hidden layer before the output is provided to the output layer. In this manner, the output layer may perform a sum of weighted inputs. Accordingly, an output of the neural network 150 (e.g., the outputs of the output layer) may be referred to as a weighted sum. The output layer may accordingly combine intermediate data received from one or more hidden layers using weights to provide output data.

In some examples, the neural network 150 may be used to provide L output signals which represent processed data corresponding to m input signals. For example, in the example of FIG. 1B, m input signals are shown ($x_1(n)$, $x_2(n)$, ... $x_m(n)$) and L output signals are provided ($y_1(n)$, $y_2(n), \ldots y_L(n)$). The neural network 150 may be trained such that the weights W used and/or the functions provided by the elements of the hidden layers cause the neural network 150 to provide output signals which represent the processed data corresponding to the m wireless input signals. The input signals may have been wireless input data associated with a wireless protocol (e.g., input data to be transmitted as wireless signals in a transmission according to the wireless protocol), and the weights and/or functions provided by the elements of the hidden layers may be selected in accordance with the wireless protocol, the input data may also be received wireless signals that is to be processed (e.g., decoded) at the neural network 150, e.g., as the neural network 150 may receive and process received wireless signals as a wireless receiver configured to operate in accordance with a certain wireless protocol. Accordingly, the neural network 150 may be trained multiple times—for example, at least twice for each wireless protocol that may be used to provide the neural network 150 with wireless input data when the neural network 150 is used for both transmit and receive, e.g., training once for transmitting wireless input data as a wireless transmitter configured to operate in accordance with a certain wireless protocol and training once for receiving wireless input data as a wireless receiver configured to operate in accordance with that certain wireless protocol.

Examples of neural networks may be trained. Training generally refers to the process of determining weights, functions, and/or other attributes to be utilized by a neural network to create a desired transformation of input data to output data. In some examples, neural networks described herein may be trained to transform wireless input data to output data (e.g., input data to be transmitted in a transmission according to the wireless protocol). In some examples, neural networks described herein may be trained to decode and/or process received wireless input data to output data (e.g., an estimate of the received wireless data as if it were received and decoded by a wireless receiver based on data from a wireless receiver on which the neural network 150 was trained). In some implementations, neural networks may be used to reduce noise present in the input data. For example, some received wireless input data may be received via a noisy wireless channel that may introduce noise in both time and frequency domains to received wireless signals. Using time-delayed versions of the wireless input data in an RNN, the noise introduced in the time and frequency domains may be compensated, as the RNN utilizes respective time and frequency correlations with respect to the time-delayed versions of the wireless input data. In this manner, neural networks may be used to reduce and/or improve errors which may be introduced by noise.

Training as described herein may be supervised or unsupervised in various examples. In some examples, training may occur using known pairs of anticipated input and desired output data. For example, training may utilize known wireless input data and output data pairs to train a neural network to receive and process subsequent wireless input data into output data (e.g., input data to be transmitted in a transmission according to the wireless protocol). In some examples, training may utilize known noisy wireless data and output data pairs to train a neural network to decode subsequent noisy wireless input data into output data (e.g., input data from a noisy wireless channel received according to a wireless protocol). In some examples, training may utilize known noisy input data and output data pairs to train a neural network to provide output data having reduced noise than input noisy wireless data. Examples of training may include determining weights to be used by a neural network, such as neural network 150 of FIG. 1B. In some examples, the same neural network hardware is used during training as will be used during operation. In some examples, however, different neural network hardware may be used during training, and the weights, functions, or other attributes determined during training may be stored for use by other neural network hardware during operation. For example, a hardware implementation, described in FIG. 1A and/or FIGS. 2A-2C, of electronic device 110 utilizing processing units 112 (e.g., any combination of one or more processing units shown in FIGS. 2A-2C).

Examples of training can be described mathematically. For example, consider input data at a time instant (n), given as: $X(n)=[x_1(n), x_2(n), \ldots, x_m(n)]^T$. The center vector for each element in hidden layer(s) of the neural network 150 (e.g., combiner 152, combiner 154, combiner 156, and combiner 158) may be denoted as $C_i$ (for $i=1, 2, \ldots, H$, where H is the element number in the hidden layer).

The output of each element in a hidden layer may then be given as:

$$h_i(n)=f_i(\|X(n)-C_i\|) \text{ for } (i=1,2,\ldots,H) \quad (1)$$

The connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$y_i(n)=\sum_{j=1}^{H}W_{ij}h_j(n)=\sum_{j=1}^{H}W_{ij}f_j(\|X(n)-C_j\|) \quad (2)$$

for $(i=1, 2, \ldots, L)$ and where L is the element number of the output of the output layer and $W_{ij}$ is the connection weight between the j'th element in the hidden layer and the i'th element in the output layer.

Generally, a neural network architecture (e.g., the neural network 150 of FIG. 1B) may include a number of elements and may have center vectors which are distributed in the input domain such that the neural network may approximate nonlinear multidimensional functions and therefore may approximate a wireless receiver or transmitter that is configured to receive or transmit (or transceive) input data (e.g., signals to be transmitted as wireless signals or received wireless signals) into output data (e.g., wireless transmission signals or decoded signals from received wireless signals). Generally, the choice of transfer function used by elements in the hidden layer may not affect the mapping performance of the neural network, and accordingly, a function may be used which may be implemented conveniently in hardware in some examples. For example, a thin-plate-spline function and/or a Gaussian function may be used in various examples and may both provide adequate approximation capabilities. Other functions may also be used.

Examples of neural networks may accordingly be specified by attributes (e.g., parameters). In some examples, two sets of parameters may be used to specify a neural network: connection weights and center vectors (e.g., thresholds). The parameters may be determined from selected input data (e.g., encoded input data) by solving an optimization function. An example optimization function may be given as:

$$E=\sum_{n=1}^{M}\|Y(n)-\overline{Y(n)}\|^2 \quad (3)$$

where M is a number of trained input vector (e.g., trained encoded data inputs) and Y(n) is an output vector computed from the sample input vector using Equations (1) and (2) above, and $\overline{Y(n)}$ is the corresponding desired (e.g., known)

output vector. The output vector $Y(n)$ may be written as: $Y(n)=(n)[y_1(n), y_2(n), \ldots y_L(n)]^T$ Various methods (e.g., gradient descent procedures) may be used to solve the optimization function. However, in some examples, another approach may be used to determine the parameters of a neural network, which may generally include two steps—(1) determining center vectors $C_i$ (i=1, 2, ..., H) and (2) determining the weights.

In some examples, the center vectors may be chosen from a subset of available sample vectors. In such examples, the number of elements in the hidden layer(s) may be relatively large to cover the entire input domain. Accordingly, in some examples, it may be desirable to apply k-means cluster algorithms. Generally, k-means cluster algorithms distribute the center vectors according to the natural measure of the attractor (e.g., if the density of the data points is high, so is the density of the centers). k-means cluster algorithms may find a set of cluster centers and partition the training samples into subsets. Each cluster center may be associated with one of the H hidden layer elements in this network. The data may be partitioned in such a way that the training points are assigned to the cluster with the nearest center. The cluster center corresponding to one of the minima of an optimization function. An example optimization function for use with a k-means cluster algorithm may be given as:

$$E_{k\_means} = \sum_{j=1}^{H} \sum_{n=1}^{M} B_{jn} \|X(n) - C_j\|^2 \quad (4)$$

where $B_{jn}$ is the cluster partition or membership function forming an H×M matrix. Each column may represent an available sample vector (e.g., known input data) and each row may represent a cluster. Each column may include a single '1' in the row corresponding to the cluster nearest to that training point, and zeros elsewhere.

The center of each cluster may be initialized to a different randomly chosen training point. Then each training example may be assigned to the element nearest to it. When all training points have been assigned, the average position of the training point for each cluster may be found and the cluster center is moved to that point. The clusters may become the desired centers of the hidden layer elements.

In some examples, for some transfer functions (e.g., the Gaussian function), the scaling factor σ may be determined, and may be determined before determining the connection weights. The scaling factor may be selected to cover the training points to allow a smooth fit of the desired network outputs. Generally, this refers to any point within the convex hull of the processing element centers may significantly activate more than one element. To achieve this goal, each hidden layer element may activate at least one other hidden layer element to a significant degree. An appropriate method to determine the scaling parameter a may be based on the P-nearest neighbor heuristic, which may be given as, $$\sigma_i = \frac{1}{P} \sum_{j=1}^{P} \|C_j - C_i\|^2 \quad (i = 1, 2, \ldots, H)$$

where $C_j$ (for i=1, 2, ..., H) are the P-nearest neighbors of $C_i$.

The connection weights may additionally or instead be determined during training. In an example of a neural network, such as neural network 150 of FIG. 1B, having one hidden layer of weighted connections an output elements which are summation units, the optimization function of Equation (3) may become a linear least-squares problem once the center vectors and the scaling parameter have been determined. The linear least-squares problem may be written as $$\min_{W} \sum_{n=1}^{M} \|Y(n) - \hat{Y}(n)\|^2 = \min_{W} \sum_{n=1}^{M} \|WF - \hat{Y}\|^2 \quad (5)$$

where $W=\{W_{ij}\}$ is the L×H matrix of the connection weights, F is an H×M matrix of the outputs of the hidden layer processing elements and whose matrix elements are computed using $F_{in}=f_i(\|X(n)-C_i\|)$ (i=1,2, ... H; n=1, 2, ..., M) and $\hat{Y}=[\hat{y}(1), \hat{y}(2), \ldots, \hat{y}(M)]$ is the L×M matrix of the desired (e.g., known) outputs. The connection weight matrix W may be found from Equation (5) and may be written as follows:

$$\overline{W} = \hat{Y}F^+ = \hat{Y} \lim_{\alpha \to 0} F^T(FF^T + \alpha I)^{-1} \quad (6)$$

where $F^+$ is the pseudo-inverse of F. In this manner, the above may provide a batch-processing method for determining the connection weights of a neural network. It may be applied, for example, where all input sample sets are available at one time. In some examples, each new sample set may become available recursively, such as in the recursive-least-squares algorithms (RLS). In such cases, the connection weights may be determined as follows.

First, connection weights may be initialized to any value (e.g., random values may be used). The output vector Y(n) may be computed using Equation (2). The error term $e_i(n)$ of each output element in the output layer may be computed as follows:

$$e_i(n)=y_i(n)-\hat{y}_i(n)(i=1,2,\ldots,L)$$

The connection weights may then be adjusted based on the error term, for example as follows:

$$W_{ij}(n+1)=W_{ij}(n)+\gamma e_i(n)f_j(\|X(n)-C_i\|) \quad (7)$$

$$(i=1,2,\ldots,L; j=1,2,\ldots M)$$

where γ is the learning-rate parameter which may be fixed or time-varying.

The total error may be computed according to the output from the output layer and the desired (known) data:

$$\in = \|Y(n)-\hat{Y}(n)\|^2 \quad (8)$$

The process may be iterated by again calculating a new output vector, error term, and again adjusting the connection weights. The process may continue until weights are identified which reduce the error to equal to or less than a threshold error.

Accordingly, the neural network 150 of FIG. 1B may be trained to determine parameters (e.g., weights) for use by the neural network 150 to perform a particular mapping between input and output data. For example, training the neural network 150 may provide one set of parameters to use when receiving wireless input data to decode that data, as a wireless receiver would, into output data. Additionally or alternatively, training the neural network 150 may provide that set of parameters to use when receiving wireless input data as experienced in a noisy wireless channel. The neural network 150 (and/or another neural network) may be trained multiple times, using different known input/output data pairs, for example. For example, in the context of decoding received wireless signals, known input/output pairs for varying demodulation mappings could be utilized. In some examples, in the same context of decoding received wireless signals, known input/output pairs for more than one aspect of a wireless receiver processing mode may be utilized, e.g., a decoding aspect, a deinterleaving aspect, and demodulation aspect, or any combination of wireless receiver processing aspects. As another example, training the neural network 150 may provide one set of parameters to use when transforming input data to output data that it is to be transmitted as wireless signals, as a wireless transmitter would process such input data.

Multiple trainings may result in multiple sets of connection weights. For example, a different set of weights may be determined for each of multiple wireless protocols—e.g., one set of weights may be determined for use in transmitting wireless input data according to a wireless protocol and another set of weights may be determined for use in receiving and decoding wireless input data according to that wireless protocol.

Recall that the structure of neural network 150 of FIG. 1B is provided by way of example only. Other multilayer neural network structures may be used in other examples. Moreover, the training procedures described herein are also provided by way of example. Other training techniques (e.g., learning algorithms) may be used, for example, to solve the local minimum problem and/or vanishing gradient problem. Determined weights and/or vectors for each decoder may be obtained by an off-line learning mode of the neural network, which may advantageously provide more resources and data. In some implementations, for example as described with reference to FIGS. 2A-2C, the hidden layers of combiners (e.g., combiner 152, combiner 154, combiner 156, and combiner 158) may include multiplication/accumulation (MAC) units, with each layer having additional MAC units. Such implementations, having accumulated the intermediate processing results in a respective processing elements (e.g., the respective MAC unit), may also include memory lookup (MLU) units that are configured to retrieve a plurality of coefficients and provide the plurality of coefficients as the connection weights (e.g., determined weights) for that respective layer of MAC units to be mixed with the input data.

Figure 1C:
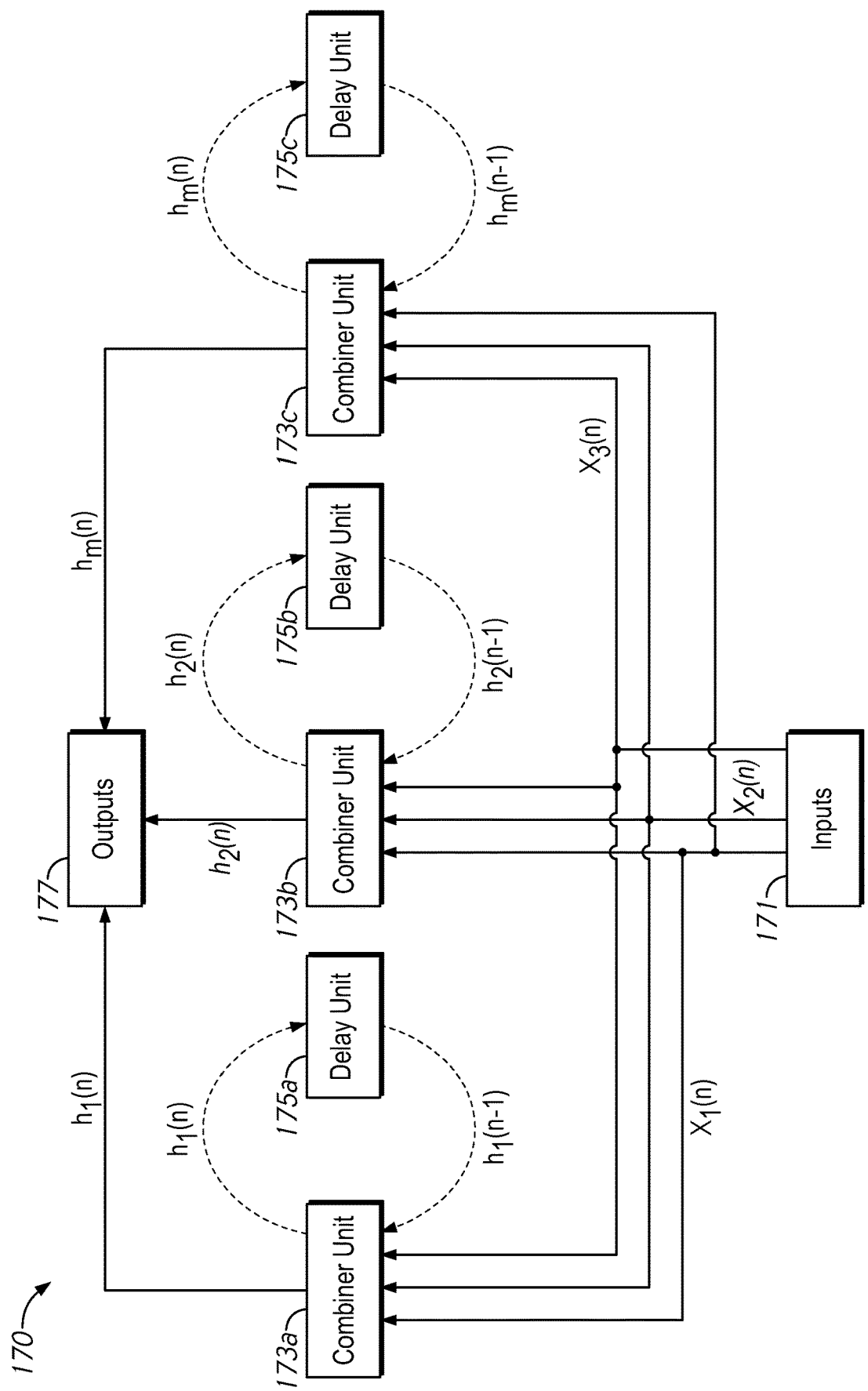
FIG. 1C is a schematic illustration of a recurrent neural network arranged in accordance with examples described herein.

FIG. 1C is a schematic illustration of a recurrent neural network arranged in accordance with examples described herein. The neural network 170 include three stages (e.g., layers): an inputs node 171; a combiner stage 173 and 175, and an outputs node 177. While three stages are shown in FIG. 1C, any number of stages may be used in other examples, e.g., as described with reference to FIGS. 2A-2C. In some implementations, the neural network 170 may have multiple combiner stages such that outputs from one combiner stage is provided to another combiners stage, until being providing to an outputs node 177. As described with reference to FIG. 2A, for example, there may be multiple combiner stages in a neural network 170. As depicted in FIG. 1C, the delay units 175a, 175b, and 175c may be optional components of the neural network 170. When such delay units 175a, 175b, and 175c are utilized as described herein, the neural network 170 may be referred to as a recurrent neural network.

The first stage of the neural network 170 includes inputs node 171. The inputs node 171 may receive input data at various inputs of the recurrent neural network. In some examples, the inputs node 171 may include multiple input nodes, such as input node 168, node 169, node 172, and node 174 of FIG. 1B. The second stage of the neural network 170 is a combiner stage including combiner units 173a, 173b, 173c; and delay units 175a, 175b, 175c. Accordingly, the combiner units 173 and delay units 175 may be collectively referred to as a stage of combiners. In some implementations, the combiner units 173a, 173b, and 173c may corresponds to combiner 152, combiner 154, and combiner 156 of FIG. 1B, for example. Accordingly, as described with respect to FIG. 1B with processing units 112 implementing such combiners, generally processing units 112 that implement the combiner units 173a-c and delay units 175a-c in the second stage may perform a nonlinear activation function using the input data from the inputs node 171 (e.g., input signals $X_1(n)$, $X_2(n)$, and $X_3(n)$). The third stage of neural network 170 includes the outputs node 177. In some examples, the outputs node 177 may include combiner 160, combiner 162, and combiner 164 of FIG. 1B. Accordingly, in some examples, the outputs nodes 177 may be referred to as a stage of combiners. Additional, fewer, and/or different components may be used in other examples.

The recurrent neural network 170 includes delay units 175a, 175b, and 175c, which generate delayed versions of the output from the respective combiner units 173a-c based on receiving such output data from the respective combiner units 173a-c. In the example, the output data of combiner units 173a-c may be represented as h(n); and, accordingly, each of the delay units 175a-c delay the output data of the combiner units 173a-c to generate delayed versions of the output data from the combiner units 173a-c, which may be represented as h(n-t). In various implementations, the amount of the delay, t, may also vary, e.g., one clock cycle, two clock cycles, or one hundred clock cycles. That is, the delay unit 175 may receive a clock signal and utilize the clock signal to identify the amount of the delay. In the example of FIG. 1C, the delayed versions are delayed by one time period, where '1' represents a time period. A time period may correspond to any number of units of time, such as a time period defined by a clock signal or a time period defined by another element of the neural network 170.

Continuing in the example of FIG. 1C, each delay unit 175a-c provides the delayed versions of the output data from the combiner units 173a-c as input to the combiner units 173a-c, to operate, optionally, as a recurrent neural network. Such delay units 175a-c may provide respective delayed versions of the output data from nodes of the combiner units 173a-c to respective input units/nodes of the combiner units 173a-c. In utilizing delayed versions of output data from combiner units 173a-c, the recurrent neural network 170 may train weights at the combiner units 173a-c that incorporate time-varying aspects of input data to be processed by such a recurrent neural network 170. Once trained, in some examples, the inputs node 171 receives wireless input data that is to be received and processed in the recurrent neural network 170 as a wireless receiver associated with a wireless protocol. Each stream of input data may correspond to a different received signal or a signal to be transmitted at corresponding antennas (e.g., antennas 131, 133, 135 of FIG. 1A). Accordingly, because an RNN 170 incorporates the delayed versions of output data from combiner units 173a-c, the time-varying nature of the input data may provide faster and more efficient processing of the input data. For example, in the context of the input data being received wireless signals, the time correlation of the received signal may be incorporated into the estimation of the decoded output data, such that the decoded, processed data is a better estimation than that of a neural network not utilizing the delay units 175a-c. In some implementations, in the context of received wireless signals from a noisy wireless channel, the recurrent neural network 170 provides individualized frequency-band, time-correlated data for the receiving and processing of noisy wireless input data. Therefore, a recurrent neural network 170 may operate more efficiently in wireless networks where signals experience time-variations in time-varying wireless channels, causing, in part, the noise in the received wireless signals. While described in the context of r input data that is to be received and decoded, it can be appreciated that the recurrent neural network 170 may also be trained and applied to input data that is to be transmitted, e.g., with the recurrent neural network 170 being implemented as a wireless transmitter in accordance with a wireless protocol.

Generally, a recurrent neural network may include multiple stages of nodes. The nodes may be implemented using processing units (e.g., processing units 112) which may execute one or more functions on inputs received from a previous stage and provide the output of the functions to the next stage of the recurrent neural network. The processing units may be implemented using, for example, one or more processors, controllers, and/or custom circuitry, such as an application specific integrated circuit (ASIC) and/or a field programmable gate array (FPGA). In some examples, the processing units may be implemented using any combination of one or more processing units 112 described with respect to FIGS. 2A-2C. The processing units may be implemented as combiners and/or summers and/or any other structure for performing functions allocated to the processing unit. In some examples, certain of the elements of neural networks described herein perform weighted sums, e.g., may be implemented using one or more multiplication/accumulation units, which may be implemented using processor(s) and/or other circuitry. In an example, the neural network 170 may be implemented by the electronic device 110 utilizing any combination of one or more processing units described with respect to FIGS. 2A-2C.

Examples of recurrent neural network training and inference can be described mathematically. Again, as an example, consider input data at a time instant (n), given as: $X(n)=[x_1(n), x_2(n), \ldots x_m(n)]^T$. The center vector for each element in hidden layer(s) of the recurrent neural network 170 (e.g., combiner units 173 including combiner 152, combiner 154, combiner 156, and combiner 158 of FIG. 1B) may be denoted as $C_i$ (for i=1, 2, ..., H, where H is the element number in the hidden layer).

The output of each element in a hidden layer may then be given as:

$$h_i(n) = f_i(\|X(n) + h_i(n-t) - C_i\|) \text{ for } (i=1,2,\ldots,H) \quad (9)$$

t may be the delay at the delay unit 175 such that the output of the combiner units 173 includes a delayed version of the output of the combiner units 173. In some examples, this may be referred to as feedback of the combiner units 173. Accordingly, each of the connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$y_i(n) = \sum_{j=1}^{H} W_{ij} h_j(n) + W_{ij} h_j(n-t) = \sum_{j=1}^{H} W_{ij} f_j(\|X(n) + h_i(n-t) - C_j\|) \quad (10)$$

for (i=1, 2, ..., L) and where L is the element number of the output of the output layer and $W_{ij}$ is the connection weight between the j'th element in the hidden layer and the i'th element in the output layer.

Additionally or alternatively, while FIG. 1C has been described with respect to a single stage of combiners (e.g., second stage) including the combiner units 173a-c and delay units 175a-c, it can be appreciated that multiple stages of similar combiner stages may be included in the neural network 170 with varying types of combiner units and varying types of delay units with varying delays, for example, as will now be described with reference to FIGS. 2A-2C.

Figure 2A:
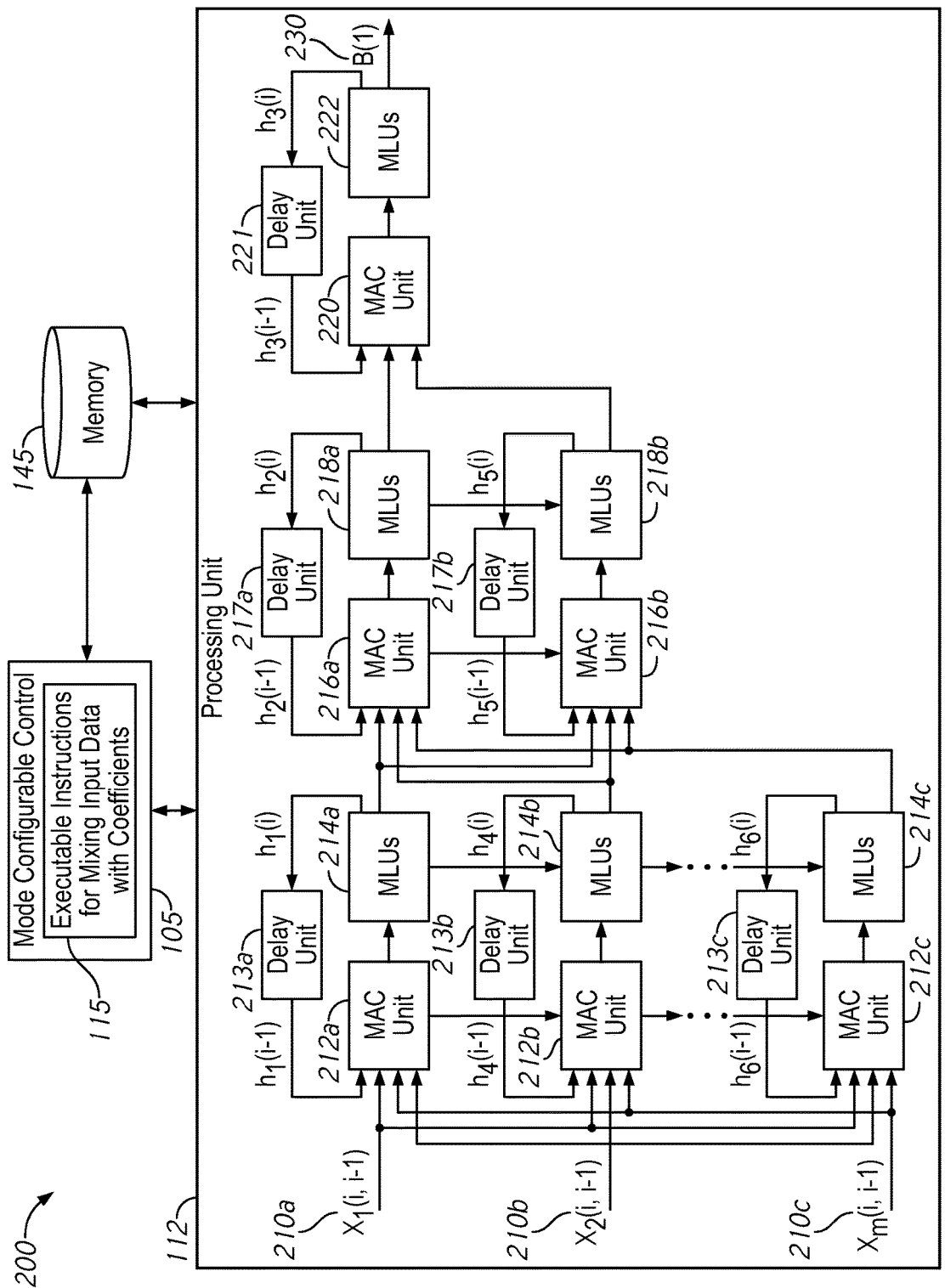
FIGS. 2A-2C are schematic illustrations of processing units arranged in systems in accordance with examples described herein.

FIG. 2A is a schematic illustration of a processing unit 112 arranged in a system 200 in accordance with examples described herein. Such a hardware implementation (e.g., system 200) may be used, for example, to implement one or more neural networks, such as the neural network 150 of FIG. 1B or recurrent neural network 170 of FIG. 1C. Additionally or alternatively, in some implementations, the processing unit 112 may receive input data 210a, 210b, and 210c from such a computing system. The input data 210a, 210b, and 210c may be data obtained from a sensor or data stored in the memory 145. In some examples, data stored in the memory 145 may be input data obtained from a plurality of antennas coupled to an electronic device 110 in which the processing unit 112 is implemented. In an example in which the electronic device 110 is coupled to the plurality of antennas 131, 133, and 135, the input data 210a $X_1(i, i-1)$ may correspond to a first RF transmission obtained at the antenna 131 at a first frequency; the input data 210b $X_2(i, i-1)$ may correspond to a second RF transmission obtained at the antenna 133 at a second frequency; and the input data 210c $X_m(i, i-1)$ may correspond to a m'th RF transmission obtained at the antenna 135 at a m'th frequency. m may represent the number of antennas, with each antenna receiving a portion of input data.

In some examples, m may also correspond to a number of wireless channels over which the input data is obtained; for example, in a MIMO transmission, an RF transmission may be obtained over multiple wireless channels at the plurality of antennas 131, 133, and 135. In an example of the input data being data to be transmitted (in contrast to being obtained), the input data 210a, 210b, 210c may corresponds to portions of input data to be processed as an RF transmission for the multiple antennas. For example, the output data 230 B(n) may be a MIMO output signal to be transmitted at the antennas 131, 133, and 135 at an electronic device that is implementing the processing unit 112 of the computing system 200.

As denoted in the representation of the input data signals, the input data 210a $X_1(i, i-1)$ includes a current portion of the input data, at time i, and a previous portion of the input data, at time i-1. For example, a current portion of the input data may be a sample obtained at the antenna 131 at a certain time period (e.g., at time i), while a previous portion of the input data may be a sample obtained at the antenna 131 at a time period previous to the certain time period (e.g., at time i-1). Accordingly, the previous portion of the input data may be referred to as a time-delayed version of the current portion of the input data. The portions of the input data at each time period may be obtained in a vector or matrix format, for example. In an example, a current portion of the input data, at time i, may be a single value; and a previous portion of the input data, at time i-1, may be a single value. Thus, the input data 210a $X_1(i, i-1)$ may be a vector. In some examples, the current portion of the input data, at time i, may be a vector value; and a previous portion of the input data, at time i-1, may be a vector value. Thus, the input data 210a $X_1$(i, i-1) may be a matrix.

Such input data, which is obtained with a current and previous portion of input data, may be representative of a Markov process, such that a causal relationship between at least the current sample and the previous sample may improve the accuracy of weight estimation for training of coefficient data to be utilized by the MAC units and MLUs of the processing unit 112. As noted previously, the input data 201 may represent data obtained at a first frequency and/or data obtained at a first wireless channel. Accordingly, the input data 210b $X_2$(i, i-1) may represent data obtained at a second frequency or at a second wireless channel, including a current portion of the input data, at time i, and a previous portion of the input data, at time i-1. And, the number of input signals obtained by the processing unit 112 may equal in some examples to a number of antennas coupled to an electronic device 110 implementing the processing unit 112. Accordingly, the input data 210c $X_m$(i, i-1) may represent data obtained at a m'th frequency or at a m'th wireless channel, including a current portion of the input data, at time i, and a previous portion of the input data, at time i-1.

The processing unit 112 may include multiplication unit/accumulation (MAC) units 212a-c, 216a-b, and 220; delay units 213a-c, 217a-b, and 221; and memory lookup units (MLUs) 214a-c, 218a-b, and 222 that, when mixed with input data obtained from the memory 145, may generate output data (e.g. B (1)) 230. Each set of MAC units and MLU units having different element numbers may be referred to as a respective stage of combiners for the processing unit 112. For example, a first stage of combiners includes MAC units 212a-c and MLUs 214a-c, operating in conjunction with delay units 213a-c, to form a first stage or "layer," as referenced with respect to FIG. 1B having "hidden" layers as various combiner stages. Continuing in the example, the second stage of combiners includes MAC units 216a-b and MLUs 218a-b, operating in conjunction with delay units 217a-b, to form a second stage or second layer of hidden layers. And the third stage of combiners may be a single combiner including the MAC unit 220 and MLU 222, operating in conjunction with delay unit 221, to form a third stage or third layer of hidden layers.

In an example of generating RF transmission for transmission, the output data 230 B(1) may be utilized as a MIMO RF signal to be transmitted at a plurality of antennas. In an example of obtaining RF transmission that were obtained at a plurality of antennas, the output data 230 B(1) may representative of a demodulated, decoded signal that was transmitted by another RF electronic device. In any case, the processing unit 112, may be provide instructions 115, stored at the mode configurable control 105, to cause the processing unit 112 to configure the multiplication units 212a-c, 216a-c, and 220 to multiply and/or accumulate input data 210a, 210b, and 210c and delayed versions of processing results from the delay units 213a-c, 271a-b, and 221 (e.g., respective outputs of the respective layers of MAC units) with coefficient data to generate the output data 230 B(1). For example, the mode configurable control 105 may execute instructions that cause the memory 145 to provide weights and/or other parameters stored in the memory 145, which may be associated with a certain wireless processing mode, to the MLUs 214a-c, 218a-b, and 222 as weights for the MAC units 212a-c, 216a-b, and 220 and delay units 213a-c, 271a-b, and 221. During operation, the mode configuration control 105 may be used to select weights and/or other parameters in memory 145 based on an indicated wireless processing mode for the processing unit 112 (e.g., the indicated wireless processing mode being from the memory 107 executing the executable instructions for a wireless processing mode 117).

As denoted in the representation of the respective outputs of the respective layers of MAC units (e.g, the outputs of the MLUs 214a-c, 218a-b, and 222), the input data to each MAC unit 212a-c, 216a-b, and 220 includes a current portion of input data, at time i, and a delayed version of a processing result, at time i-1. For example, a current portion of the input data may be a sample obtained at the antenna 131 at a certain time period (e.g., at time i), while a delayed version of a processing result may be obtained from the output of the delay units 213a-c, 271a-b, and 221, which is representative of a time period previous to the certain time period (e.g., as a result of the introduced delay). Accordingly, in using such input data, obtained from both a current period and at least one previous period, output data 230 B(1) may be representative of a Markov process, such that a causal relationship between at least data from a current time period and a previous time period may improve the accuracy of weight estimation for training of coefficient data to be utilized by the MAC units and MLUs of the processing unit 112 or inference of wireless input data or noisy wireless input data in utilizing the processing unit 112. As noted previously, the input data 201 may represent data obtained at a first frequency and/or data obtained at a first wireless channel. Accordingly, the input data 210b $X_2$(i, i-1) may represent data obtained at a second frequency or at a second wireless channel. And, the number of input signals obtained by the processing unit 112 may equal in some examples to a number of antennas coupled to an electronic device 110 implementing the processing unit 112. Accordingly, the input data 210c $X_m$(i, i-1) may represent data obtained at a m'th frequency or at a m'th wireless channel, including a current portion of the input data, at time i. Accordingly, in utilizing delayed versions of output data from 213a-c, 271a-b, and 221 the recurrent neural network 170 provides individualized frequency-band, time-correlation data for the receiving and processing of noisy wireless input data, e.g., as received from noisy wireless channels. Therefore, a recurrent neural network 170 may operate more efficiently in wireless networks where signals experience time-variations in time-varying wireless channels.

In an example of executing such instructions 115 for mixing input data with coefficients, at a first layer of the MAC units 212a-c and MLUs 214a-c, the multiplication unit/accumulation units 212a-c are configured to multiply and accumulate at least two operands from corresponding input data 210a, 210b, or 210c and an operand from a respective delay unit 213a-c to generate a multiplication processing result that is provided to the MLUs 214a-c. For example, the multiplication unit/accumulation units 212a-c may perform a multiply-accumulate operation such that three operands, M N, and T are multiplied and then added with P to generate a new version of P that is stored in its respective MLU 214a-c. Accordingly, the MLU 214a latches the multiplication processing result, until such time that the stored multiplication processing result is be provided to a next layer of MAC units. The MLUs 214a-c, 218a-b, and 222 may be implemented by any number of processing elements that operate as a memory look-up unit such as a D, T, SR, and/or JK latches.

The MLUs 214a-c, 218a-b, and 222 shown in FIG. 2A may generally perform a predetermined nonlinear mapping from input to output. For example, the MLUs 214a-c, 218a-b, and 222 may be used to evaluate at least one non-linear function. In some examples, the contents and size of the various MLUs 214a-c, 218a-b, and 222 depicted may be different and may be predetermined. In some examples, one or more of the MLUs 214a-c, 218a-b, and 222 shown in FIG. 2A may be replaced by a single consolidated MLU (e.g., a table look-up). Examples of nonlinear mappings (e.g., functions) which may be performed by the MLUs 214a-c, 218a-b, and 222 include Gaussian functions, piecewise linear functions, sigmoid functions, thin-plate-spline functions, multiquadratic functions, cubic approximations, and inverse multi-quadratic functions. Examples of functions have been described with reference also to FIG. 1B. In some examples, selected MLUs 214a-c, 218a-b, and 222 may be by-passed and/or may be de-activated, which may allow an MLU and its associated MAC unit to be considered a unity gain element.

Additionally in the example, the MLU 214a provides the processing result to the delay unit 213a. The delay unit 213a delays the processing result (e.g., $h_1(i)$) to generate a delayed version of the processing result (e.g., $h_1(i-1)$) to output to the MAC unit 212a as operand T. While the delay units 213a-c, 217a-b, and 221 of FIG. 2A are depicted introducing a delay of '1', it can be appreciated that varying amounts of delay may be introduced to the outputs of first layer of MAC units. For example, a clock signal that introduced a sample delay of '1' (e.g., $h_1(i-1)$) may instead introduce a sample delay of '2', '4', or '100'. In various implementations, the delay units 213a-c, 217a-b, and 221 may correspond to any number of processing units that can introduce a delay into processing circuitry using a clock signal or other time-oriented signal, such as flops (e.g., D-flops) and/or one or more various logic gates (e.g., AND, OR, NOR, etc . . . ) that may operate as a delay unit.

In the example of a first hidden layer of a recurrent neural network, the MLUs 214a-c may retrieve coefficient data stored in the memory 145, which may be weights associated with weights to be applied to the first layer of MAC units to both the data from the current period and data from a previous period (e.g., the delayed versions of first layer processing results). For example, the MLU 214a can be a table look-up that retrieves one or more coefficients (e.g., specific coefficients associated with a first frequency) to be applied to both operands M and N, as well as an additional coefficient to be applied to operand T. The MLUs 214a-c also provide the generated multiplication processing results to the next layer of the MAC units 216a-b and MLUs 218a-b. The additional layers of the MAC units 216a, 216b and MAC unit 220 working in conjunction with the MLUs 218a, 218b and MLU 222, respectively, may continue to process the multiplication results to generate the output data 230 B(1). Using such a circuitry arrangement, the output data 230 B(1) may be generated from the input data 210a, 210b, and 210c.

Figure 2B:
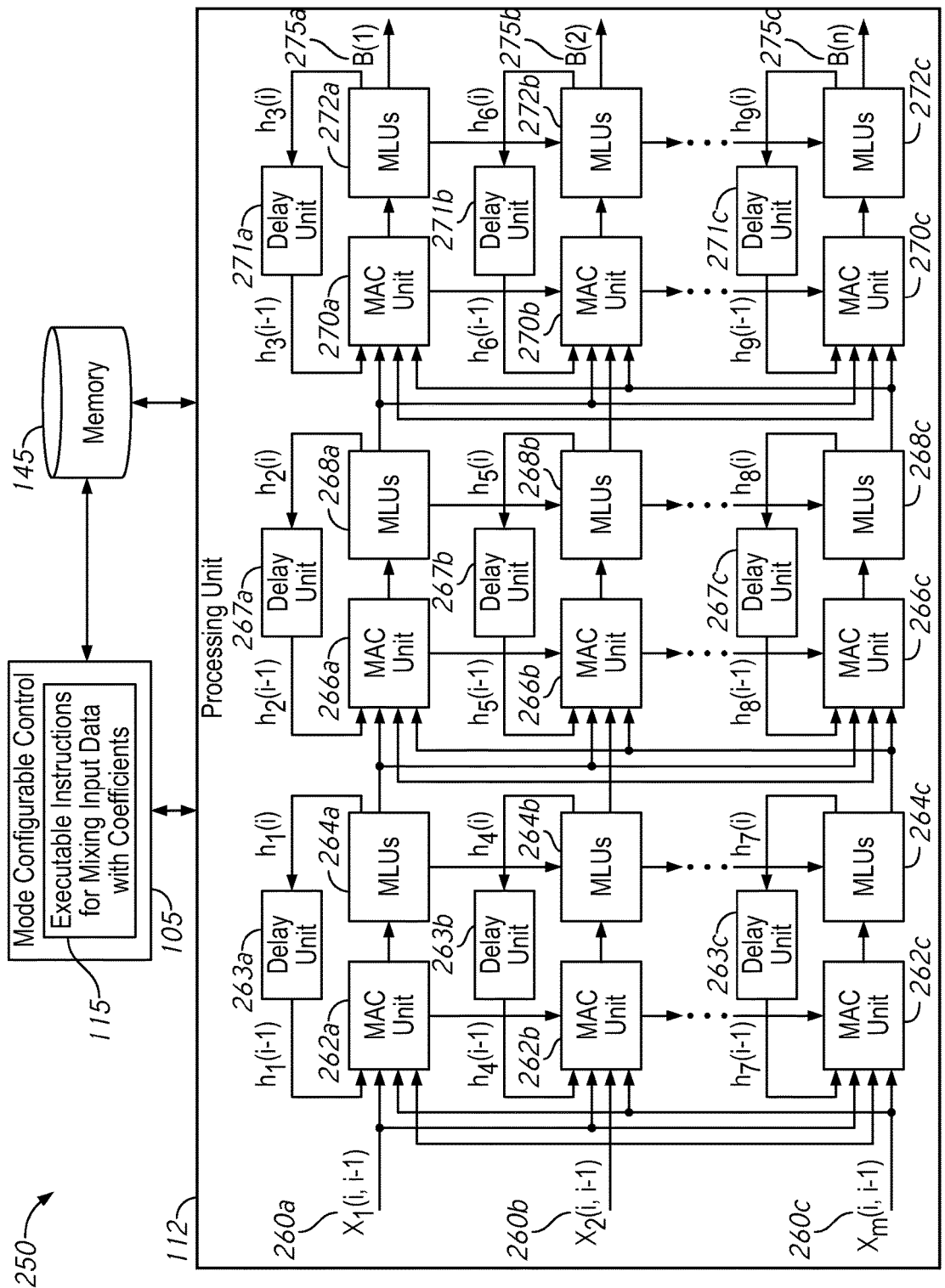

Advantageously, the processing unit 112 of system 200 may utilize a reduced number of MAC units and/or MLUs, e.g., as compared to the processing unit 112 of FIG. 2B. The number of MAC units and MLUs in each layer of the processing unit 112 is associated with a number of channels and/or a number of antennas coupled to a device in which the processing unit 112 is being implemented. For example, the first layer of the MAC units and MLUs may include m number of those units, where m represents the number of antennas, each antenna receiving a portion of input data. Each subsequent layer may have a reduced portion of MAC units, delay units, and MLUs. As depicted, in FIG. 2A for example, a second layer of MAC units 216a-b, delay unit 217a-b, and MLUs 218a-b may include m-MAC units and MLUs, when m=3. Accordingly, the last layer in the processing unit 112, including the MAC unit 220, delay unit 221, and MLU 222, includes only one MAC, one delay unit, and one MLU. Because the processing unit 112 utilizes input data 210a, 210b, and 210c that may represent a Markov process, the number of MAC units and MLUs in each subsequent layer of the processing unit may be reduced, without a substantial loss in precision as to the output data 230 B(1); for example, when compared to a processing unit 112 that includes the same number of MAC units and MLUs in each layer, like that of processing unit 112 of system 250 in FIG. 2B.

The coefficient data, for example from memory 145, can be mixed with the input data 210a-210c and delayed version of processing results to generate the output data 230 B(1). For example, the relationship of the coefficient data to the output data 230 B(1) based on the input data 210a-c and the delayed versions of processing results may be expressed as:

$$B(1)=a^1 * f(\Sigma_{j=1}^{m-1} a^{(m-1)} f_j(\Sigma_{k=1}^{m} a^{(m)} X_k(i))) \qquad (11)$$

where $a^{(m)}$, $a^{(m-1)}$, $a^1$ are coefficients for the first layer of multiplication/accumulation units 212a-c and outputs of delay units 213a-c; the second layer of multiplication/accumulation units 216a-b and outputs of delay units 217a-b; and last layer with the multiplication/accumulation unit 220 and output of delay unit 221, respectively; and where f (•) is the mapping relationship which may be performed by the memory look-up units 214a-c and 218a-b. As described above, the memory look-up units 214a-c and 218a-b retrieve coefficients to mix with the input data and respective delayed versions of each layer of MAC units. Accordingly, the output data may be provided by manipulating the input data and delayed versions of the MAC units with the respective multiplication/accumulation units using a set of coefficients stored in the memory. The set of coefficients may be associated with a desired wireless protocol. The resulting mapped data may be manipulated by additional multiplication/accumulation units and additional delay units using additional sets of coefficients stored in the memory associated with the desired wireless protocol. The sets of coefficients multiplied at each stage of the processing unit 112 may represent or provide an estimation of the processing of the input data in specifically-designed hardware (e.g., an FPGA).

Further, it can be shown that the system 200, as represented by Equation (11), may approximate any nonlinear mapping with arbitrarily small error in some examples and the mapping of system 200 may be determined by the coefficients $a^{(m)}$, $a^{(m-1)}$, $a^1$. For example, if such coefficient data is specified, any mapping and processing between the input data 210a-210c and the output data 230 may be accomplished by the system 200. For example, the coefficient data may represent non-linear mappings of the input data 210a-c to the output data B(1) 230. In some examples, the non-linear mappings of the coefficient data may represent a Gaussian function, a piece-wise linear function, a sigmoid function, a thin-plate-spline function, a multi-quadratic function, a cubic approximation, an inverse multi-quadratic function, or combinations thereof. In some examples, some or all of the memory look-up units 214a-c, 218a-b may be deactivated. For example, one or more of the memory look-up units 214a-c, 218a-b may operate as a gain unit with the unity gain. Such a relationship, as derived from the circuitry arrangement depicted in system 200, may be used to train an entity of the computing system 200 to generate coefficient data. For example, using Equation (11), an entity of the computing system 200 may compare input data to the output data to generate the coefficient data.

Each of the multiplication unit/accumulation units 212a-c, 216a-b, and 220 may include multiple multipliers, multiple accumulation unit, or and/or multiple adders. Any one of the multiplication unit/accumulation units 212a-c, 216a-b, and 220 may be implemented using an ALU. In some examples, any one of the multiplication unit/accumulation units 212a-c, 216a-b, and 220 can include one multiplier and one adder that each perform, respectively, multiple multiplications and multiple additions. The input-output relationship of a multiplication/accumulation unit 212a-c, 216a-b, and 220 may be represented as:

$$B_{out} = \sum_{i=1}^{I} C_i * B_{in}(i) \tag{12}$$

where "I" represents a number to perform the multiplications in that unit, $C_i$ the coefficients which may be accessed from a memory, such as memory 145, and $B_{in}(i)$ represents a factor from either the input data 210a-c or an output from multiplication unit/accumulation units 212a-c, 216a-b, and 220. In an example, the output of a set of multiplication unit/accumulation units, $B_{out}$, equals the sum of coefficient data, $C_i$ multiplied by the output of another set of multiplication unit/accumulation units, $B_{,in}(i)$. $B_{in}(i)$ may also be the input data such that the output of a set of multiplication unit/accumulation units, $B_{out}$, equals the sum of coefficient data, $C_i$ multiplied by input data.

In some examples, the instructions 115 are executed to determine whether some of the coefficient data is identical. In such a case, the instructions 117 may be executed to facilitate selection of a single memory look-up unit for identical coefficients. For example, if the coefficient data to be retrieved by the memory look-up units 214a and 214b are identical, then a single memory look-up unit 214 could replace the memory look-up units 214a and 214b. Continuing in the example, the instructions 117 may be further executed to configure memory look-up unit 214a to receive input from both multiplication unit/accumulation unit 212a and multiplication unit/accumulation unit 212b, at different times or at the same time.

In some examples where the processing unit 112 is used to provide data in accordance with a wireless protocol with input data to be transmitted in a transmission according to the wireless protocol, the output data B(1) 230 may be derived from the inputs of the system 200, in the following manner. The input data 210a-c may be represented as symbols to be modulated and to generate output data B(1) 230 for a DAC, thereby formatting the output data for transmission by an antenna (e.g., an RF antenna). In some examples, the inputs 210a-c may be expressed as:

$$x(n) = \sum_{k=0}^{K-1} d(k, m) e^{-j2\pi \frac{kn}{N}} \tag{13}$$

$$x(n) = \sum_{m=0}^{M-1} \sum_{k=0}^{K-1} d(k, m)g[n] * \delta[n - mN] e^{-j2\pi \frac{kn}{N}} \tag{14}$$

where n is the time index, k is the sub-carrier index, m is the time-symbol index, M is the number of symbols per sub-carrier, K is the number of active sub-carriers and N is the total number of sub-carriers (e.g., the length of Discrete Fourier Transform (DFT)), x(n) is the input data X (i,j) 210a-c, n] are the shaping filter coefficients and d (k,m) is the coded data related to m'th symbol. In some examples where the system 200 implements OFDM, Equation (13) may be further generalized to:

$$x(n) = \sum_{k=0}^{K-1} d(k,m) * g_k(n) \tag{15}$$

where gk(n) is the impulse response of the k'th filter. Accordingly, a filter with a rectangular impulse response can represent the input data X (i,j) 210a-c. And Equation (15) may also be expressed as:

$$x(n) = \sum_{b=0}^{B-1} \sum_{k=0}^{b-1} d(k,m) * g_k(b,n) \tag{16}$$

where B is the number of sub-bands, $K_b$ is the number of subcarriers in b'th sub-band, $g_k$ (b, n) is the impulse response of the corresponding k'th filter in b'th sub-band.

FIG. 2B is a schematic illustration of a processing unit 112 arranged in a system 250 in accordance with examples described herein. Such a hardware implementation (e.g., system 250) may be used, for example, to implement one or more neural networks, such as the neural network 150 of FIG. 1B or recurrent neural network 170 of FIG. 1C. Additionally or alternatively, in some implementations, the processing unit 112 may receive input data 210a, 210b, and 210c from a computing system 100 of FIG. 1A. For example, the processor unit 112 may be implemented as a processing unit 112 in the example of FIG. 1A. Similarly described elements of FIG. 2B may operate as described with respect to FIG. 2A, but may also include additional features as described with respect to FIG. 2B. For example, FIG. 2B depicts MAC units 262a-c and delay units 263a-c that may operate as described with respect MAC units 212a-c and delay units 213a-c of FIG. 2A. Accordingly, elements of FIG. 2B, whose numerical indicator is offset by 50 with respect to FIG. 2A, include similarly elements of the processing element 112; e.g., MAC unit 266a operates similarly with respect to MAC unit 216a. The system 250, including processing element 112, also includes additional features not highlighted in the processing element 112 of FIG. 2A. For example, the processing unit 112 of FIG. 2B additionally includes MAC units 266c and 270b-c; delay units 267c and 271b-c; and MLUs 268c and 272b-c, such that the output data is provided as 275a-c, rather than as singularly in FIG. 2A as B(1) 230. Advantageously, the system 250 including a processing element 112 may process the input data 260a-c to generate the output data 275a-c with greater precision. For example, the output data 275a-c may process the input data 260a-260c with additional coefficient retrieved at MLU 268c and multiplied and/or accumulated by additional MAC units 266c and 270b-c and additional delay units 267c and 271b-c. For example, such additional processing may result in output data that is more precise with respect providing output data in a processing mode representative of a wireless transmitter (e.g., a wireless transmitter processing mode); a processing mode representative of a wireless receiver (e.g., a wireless receiver processing mode); or any processing mode disclosed herein. In implementations where board space (e.g., a printed circuit board) is not a primary factor in design, implementations of the processing unit 112 of FIG. 2B may be desirable as compared to that of processing unit 112 of FIG. 2A; which, in some implementations may occupy less board space as a result of having fewer elements than the processing unit 112 of FIG. 2B.

Additionally or alternatively, the processing unit 112 of system 250 may also be utilized for applications in which each portion of the output data 275a-c is to be transmitted as a MIMO signal on a corresponding antenna. For example, the output data 275a may be transmitted as a portion of a MIMO transmission at a first antenna having a first frequency; the output data 275*b* may be transmitted as a second portion of a MIMO transmission at a second antenna having a second frequency; and the output data 275*c* may be transmitted as a n'th portion of the MIMO transmission at a n'th antenna having an n'th frequency.

Figure 2C:
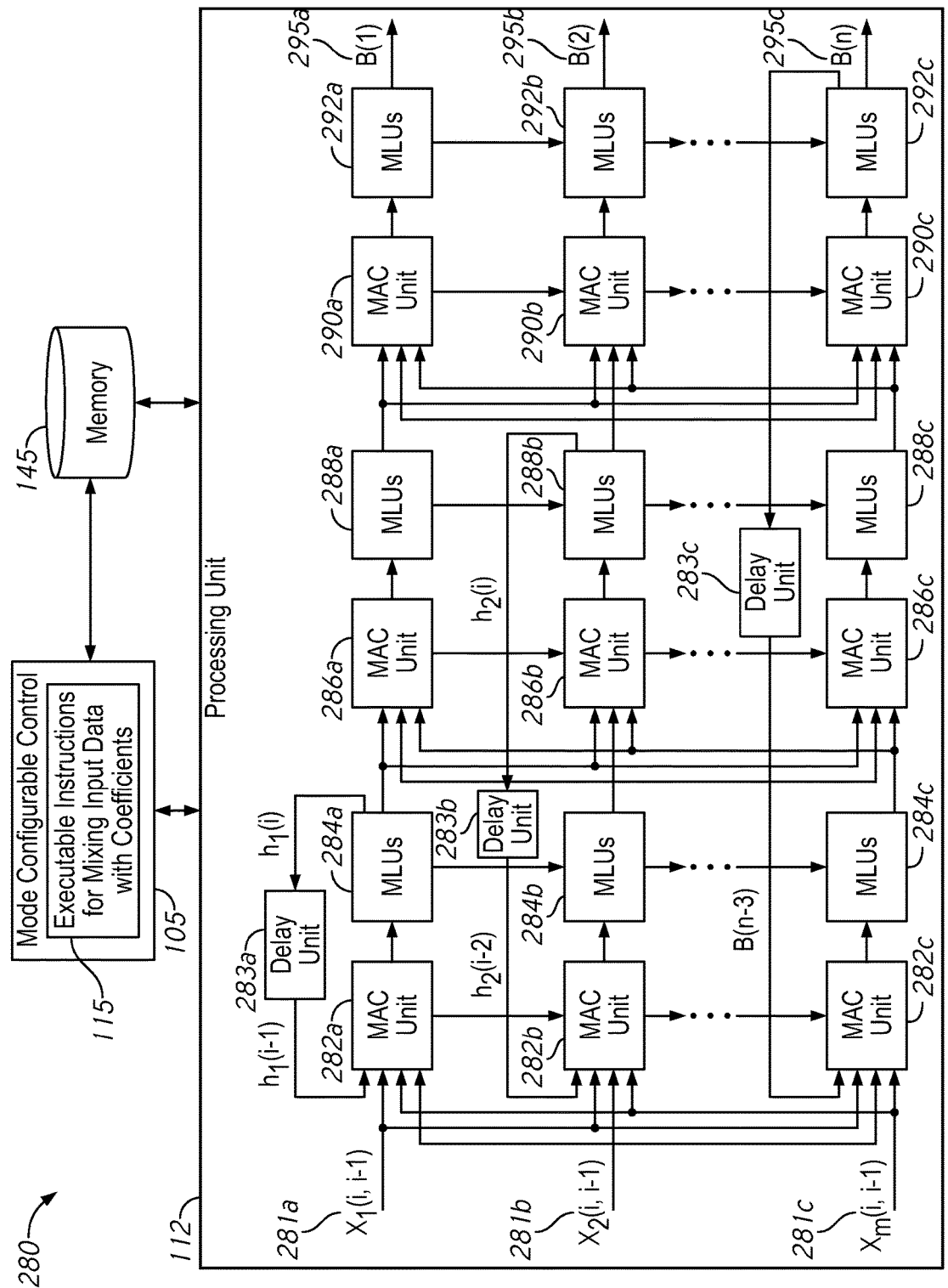

While processing element 112 is described in the context of FIGS. 2A and 2B as a single processing element 112, the features may also be implemented in the processing elements 112 of FIG. 1A, such that the description of the single processing element 112 in FIG. 2A, 2B, or 2C is interchangeable as a processing element as implemented throughout the examples described herein. Therefore, it can be appreciated that, while referring to a single processing element 112 in FIG. 2A, 2B, or 2C, the electronic device 110 may have multiple processing elements 112, like FIG. 1A, to also have the same features as described with respect a single processing element 112 of FIG. 2A, 2B, or 2C.

FIG. 2C is a schematic illustration of a processing unit 112 arranged in a system 280 in accordance with examples described herein. Such a hardware implementation (e.g., system 280) may be used, for example, to implement one or more neural networks, such as the neural network 150 of FIG. 1B or recurrent neural network 170 of FIG. 1C. Additionally or alternatively, in some implementations, the processor unit 112 may be implemented as a processing unit 112 in the example of FIG. 1A. Similarly described elements of FIG. 2C may operate as described with respect to FIG. 2B, except for the delay units 263*a-c*, 267*a-c*, and 271*a-c* of FIG. 2B. For example, FIG. 2C depicts MAC units 282*a-c* and delay units 283*a-c* that may operate as described with respect to MAC units 262*a-c* and delay units 263*a-c* of FIG. 2B. Accordingly, elements of FIG. 2C, whose numerical indicator is offset by 20 with respect to FIG. 2B, include similarly elements of the processing element 112; e.g., MAC unit 286*a* operates similarly with respect to MAC unit 266*a*.

The system 280, including processing element 112, also includes additional features not highlighted in the processing element 112 of FIG. 2B. Different than FIG. 2B, FIG. 2C depicts delay units 283*a*, 283*b*, and 283*c*. Accordingly, the processing unit of FIG. 2C illustrate that processing units 112 may include varying arrangements to the placement of the inputs and outputs of delay units, as illustrated with delay units 283*a*, 283*b*, and 283*c*. For example, the output of MLUs 288*b* may be provided to delay unit 283*b*, to generate a delayed version of that processing result from the second layer of MAC units, as an input to the first layer of MAC units, e.g., as an input to MAC unit 282*b*. Accordingly, the processing unit 112 of system 280 is illustrative that delayed versions of processing results may be provided as inputs to other hidden layers, different than the processing unit 112 of system 250 in FIG. 2B showing respective delayed versions being provided as inputs to the same layer in which those delayed versions were generated (e.g., the output of MLU 268*b* is provided to delay unit 267*b*, to generate a delayed version for the MAC unit 266*b* in the same layer from which the processing result was outputted). Therefore, in the example, even the output B(n) 295*c* may be provided, from the last hidden layer, to the first hidden layer (e.g., as an input to MAC unit 282*c*).

Advantageously, such delayed versions of processing results, which may be provided as inputs to different or additional hidden layers, may better compensate "higher-order" memory effects in a recurrent neural network 170 that implements one or more processing units 112 of FIG. 2C, e.g., as compared to the processing unit(s) 112 of FIG. 2A or 2B. For example, higher-order memory effects model the effects of leading and lagging envelope signals used during training of the recurrent neural network 170, to provide output data representative of an RF transmission being processed according to a processing mode selection. The RF transmission may be input data to be transmitted as wireless signals in a transmission according to the wireless protocol, data received in accordance with a wireless protocol, and/or received wireless signals that is to be processed (e.g., decoded). In the example, a recurrent neural network 170 that estimates the output data may include varying delayed versions of processing results that corresponds to such leading and lagging envelopes (e.g., of various envelopes encapsulating an RF transmission to be estimated). Accordingly, implementing the processing unit 112 incorporates such higher-order memory effects, e.g., for an inference of a recurrent neural network 170, to provide output data 295*a-c* based on input data 281*a-c*.

Additionally or alternatively, the processing unit 112 of system 280 may also be utilized for applications in which each portion of the output data 295*a-c* is to be transmitted as a MIMO signal on a corresponding antenna. For example, the output data 295*a* may be transmitted as a portion of a MIMO transmission at a first antenna having a first frequency; the output data 295*b* may be transmitted as a second portion of a MIMO transmission at a second antenna having a second frequency; and the output data 295*c* may be transmitted as a n'th portion of the MIMO transmission at a n'th antenna having an n'th frequency.

While processing element 112 is described in the context of FIGS. 2A, 2B, and 2C as a single processing element 112, the features may also be implemented in the processing elements 112 of FIG. 1A, such that the description of the single processing element 112 in FIG. 2A, 2B, 2C is interchangeable as a processing element as implemented throughout the examples described herein. Therefore, it can be appreciated that, while referring to a single processing element 112 in FIG. 2A, 2B, 2C the electronic device 110 may have multiple processing elements 112, like FIG. 1A, to also have the same features as described with respect a single processing element 112 of FIG. 2A, 2B, or 2C.

FIG. 3 is a schematic illustration of a wireless transmitter 300. The wireless transmitter 300 receives a data signal 310 and performs operations to generate wireless communication signals for transmission via the antenna 336. The wireless transmitter 300 may be utilized to implement the electronic device 110 of FIGS. 1A, 2A, 2B and 2C as a wireless transmitter, for example. The transmitter output data xN(n) 310 is amplified by a power amplifier 332 before the output data are transmitted on an RF antenna 336. The operations to the RF-front end may generally be performed with analog circuitry or processed as a digital baseband operation for implementation of a digital front-end. The operations of the RF-front end include a scrambler 304, a coder 308, an interleaver 312, a modulation mapping 316, a frame adaptation 320, an IFFT 324, a guard interval 326, and frequency up-conversion 328.

The scrambler 304 may convert the input data to a pseudo-random or random binary sequence. For example, the input data may be a transport layer source (such as MPEG-2 transport stream and other data) that is converted to a Pseudo Random Binary Sequence (PRBS) with a generator polynomial. While described in the example of a generator polynomial, various scramblers 304 are possible.

The coder 308 may encode the data outputted from the scrambler to code the data. For example, a Reed-Solomon (RS) encoder, turbo encoder may be used as a first coder to generate a parity block for each randomized transport packet fed by the scrambler 304. In some examples, the length of parity block and the transport packet can vary according to various wireless protocols. The interleaver 312 may interleave the parity blocks output by the coder 308, for example, the interleaver 312 may utilize convolutional byte interleaving. In some examples, additional coding and interleaving can be performed after the coder 308 and interleaver 312. For example, additional coding may include a second coder that may further code data output from the interleaver, for example, with a punctured convolutional coding having a certain constraint length. Additional interleaving may include an inner interleaver that forms groups of joined blocks. While described in the context of a RS coding, turbo coding, and punctured convolution coding, various coders 308 are possible, such as a low-density parity-check (LDPC) coder or a polar coder. While described in the context of convolutional byte interleaving, various interleavers 312 are possible.

The modulation mapping 316 may modulate the data output from the interleaver 312. For example, quadrature amplitude modulation (QAM) may be used to map the data by changing (e.g., modulating) the amplitude of the related carriers. Various modulation mappings may be used, including, but not limited to: Quadrature Phase Shift Keying (QPSK), SCMA NOMA, and MUSA (Multi-user Shared Access). Output from the modulation mapping 316 may be referred to as data symbols. While described in the context of QAM modulation, various modulation mappings 316 are possible. The frame adaptation 320 may arrange the output from the modulation mapping according to bit sequences that represent corresponding modulation symbols, carriers, and frames.

The IFFT 324 may transform symbols that have been framed into sub-carriers (e.g., by frame adaptation 320) into time-domain symbols. Taking an example of a 5G wireless protocol scheme, the IFFT can be applied as N-point IFFT:

$$x_k = \sum_{n=1}^{N} X_n e^{j2\pi kn/N} \quad (17)$$

where $X_n$ is the modulated symbol sent in the nth 5G sub-carrier. Accordingly, the output of the IFFT 324 may form time-domain 5G symbols. In some examples, the IFFT 324 may be replaced by a pulse shaping filter or poly-phase filtering banks to output symbols for frequency up-conversion 328.

In the example of FIG. 3, the guard interval 326 adds a guard interval to the time-domain 5G symbols. For example, the guard interval may be a fractional length of a symbol duration that is added, to reduce inter-symbol interference, by repeating a portion of the end of a time-domain 5G symbol at the beginning of the frame. For example, the guard interval can be a time period corresponding to the cyclic prefix portion of the 5G wireless protocol scheme.

The frequency up-conversion 328 may up-convert the time-domain 5G symbols to a specific radio frequency. For example, the time-domain 5G symbols can be viewed as a baseband frequency range and a local oscillator can mix the frequency at which it oscillates with the 5G symbols to generate 5G symbols at the oscillation frequency. A digital up-converter (DUC) may also be utilized to convert the time-domain 5G symbols. Accordingly, the 5G symbols can be up-converted to a specific radio frequency for an RF transmission.

Before transmission, at the antenna 336, a power amplifier 332 may amplify the transmitter output data $x_N(n)$ 310 to output data for an RF transmission in an RF domain at the antenna 336. The antenna 336 may be an antenna designed to radiate at a specific radio frequency. For example, the antenna 336 may radiate at the frequency at which the 5G symbols were up-converted. Accordingly, the wireless transmitter 300 may transmit an RF transmission via the antenna 336 based on the data signal 310 received at the scrambler 304. As described above with respect to FIG. 3, the operations of the wireless transmitter 300 can include a variety of processing operations. Such operations can be implemented in a conventional wireless transmitter, with each operation implemented by specifically-designed hardware for that respective operation. For example, a DSP processing unit may be specifically-designed to implement the IFFT 324. As can be appreciated, additional operations of wireless transmitter 300 may be included in a conventional wireless receiver.

Figure 4:
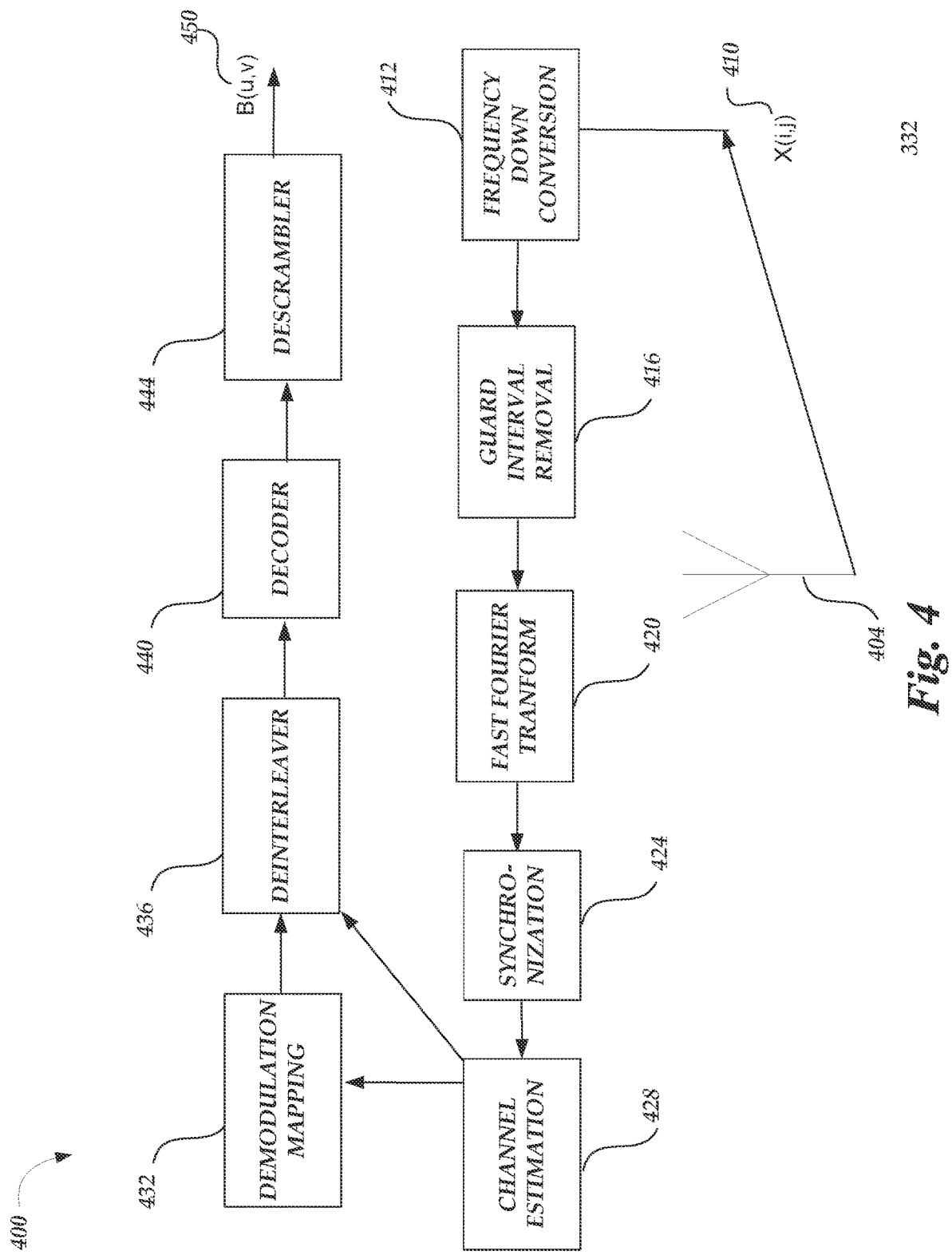
FIG. 4 is a schematic illustration of wireless receiver.

FIG. 4 is a schematic illustration of wireless receiver 400. The wireless receiver 400 receives input data X (i,j) 410 from an antenna 404 and performs operations of a wireless receiver to generate receiver output data at the descrambler 444. The wireless receiver 400 may be utilized to implement the electronic device 110 of FIGS. 1A, 2A, 2B and 2C as a wireless receiver, for example. The antenna 404 may be an antenna designed to receive at a specific radio frequency. The operations of the wireless receiver may be performed with analog circuitry or processed as a digital baseband operation for implementation of a digital front-end. The operations of the wireless receiver include a frequency down-conversion 412, guard interval removal 416, a fast Fourier transform 420, synchronization 424, channel estimation 428, a demodulation mapping 432, a deinterleaver 436, a decoder 440, and a descrambler 444.

The frequency down-conversion 412 may down-convert the frequency domain symbols to a baseband processing range. For example, continuing in the example of a 5G implementation, the frequency-domain 5G symbols may be mixed with a local oscillator frequency to generate 5G symbols at a baseband frequency range. A digital down-converter (DDC) may also be utilized to convert the frequency domain symbols. Accordingly, the RF transmission including time-domain 5G symbols may be down-converted to baseband. The guard interval removal 416 may remove a guard interval from the frequency-domain 5G symbols. The FFT 420 may transform the time-domain 5G symbols into frequency-domain 5G symbols. Taking an example of a 5G wireless protocol scheme, the FFT can be applied as N-point FFT:

$$X_n = \sum_{k=1}^{N} x_k e^{-j2\pi kn/N} \quad (18)$$

where $X_n$ is the modulated symbol sent in the nth 5G sub-carrier. Accordingly, the output of the FFT 420 may form frequency-domain 5G symbols. In some examples, the FFT 420 may be replaced by poly-phase filtering banks to output symbols for synchronization 424.

The synchronization 424 may detect pilot symbols in the 5G symbols to synchronize the transmitted data. In some examples of a 5G implementation, pilot symbols may be detected at the beginning of a frame (e.g., in a header) in the time-domain. Such symbols can be used by the wireless receiver 400 for frame synchronization. With the frames synchronized, the 5G symbols proceed to channel estimation 428. The channel estimation 428 may also use the time-domain pilot symbols and additional frequency-domain pilot symbols to estimate the time or frequency effects (e.g., path loss) to the received signal.

For example, a channel may be estimated according to N signals received through N antennas (in addition to the antenna 404) in a preamble period of each signal. In some examples, the channel estimation 428 may also use the guard interval that was removed at the guard interval removal 416. With the channel estimate processing, the channel estimation 428 may compensate for the frequency-domain 5G symbols by some factor to minimize the effects of the estimated channel. While channel estimation has been described in terms of time-domain pilot symbols and frequency-domain pilot symbols, other channel estimation techniques or systems are possible, such as a MIMO-based channel estimation system or a frequency-domain equalization system.

The demodulation mapping 432 may demodulate the data outputted from the channel estimation 428. For example, a quadrature amplitude modulation (QAM) demodulator can map the data by changing (e.g., modulating) the amplitude of the related carriers. Any modulation mapping described herein can have a corresponding demodulation mapping as performed by demodulation mapping 432. In some examples, the demodulation mapping 432 may detect the phase of the carrier signal to facilitate the demodulation of the 5G symbols. The demodulation mapping 432 may generate bit data from the 5G symbols to be further processed by the deinterleaver 436.

The deinterleaver 436 may deinterleave the data bits, arranged as parity block from demodulation mapping into a bit stream for the decoder 440, for example, the deinterleaver 436 may perform an inverse operation to convolutional byte interleaving. The deinterleaver 436 may also use the channel estimation to compensate for channel effects to the parity blocks.

The decoder 440 may decode the data outputted from the scrambler to code the data. For example, a Reed-Solomon (RS) decoder or turbo decoder may be used as a decoder to generate a decoded bit stream for the descrambler 444. For example, a turbo decoder may implement a parallel concatenated decoding scheme. In some examples, additional decoding and/or deinterleaving may be performed after the decoder 440 and deinterleaver 436. For example, additional decoding may include another decoder that may further decode data output from the decoder 440. While described in the context of a RS decoding and turbo decoding, various decoders 440 are possible, such as low-density parity-check (LDPC) decoder or a polar decoder.

The descrambler 444 may convert the output data from decoder 440 from a pseudo-random or random binary sequence to original source data. For example, the descrambler 44 may convert decoded data to a transport layer destination (e.g., MPEG-2 transport stream) that is descrambled with an inverse to the generator polynomial of the scrambler 304. The descrambler thus outputs receiver output data. Accordingly, the wireless receiver 400 receives an RF transmission including input data X (i,j) 410 via to generate the receiver output data.

As described herein, for example with respect to FIG. 4, the operations of the wireless receiver 400 can include a variety of processing operations. Such operations can be implemented in a conventional wireless receiver, with each operation implemented by specifically-designed hardware for that respective operation. For example, a DSP processing unit may be specifically-designed to implement the FFT 420. As can be appreciated, additional operations of wireless receiver 400 may be included in a conventional wireless receiver.

Figure 5:
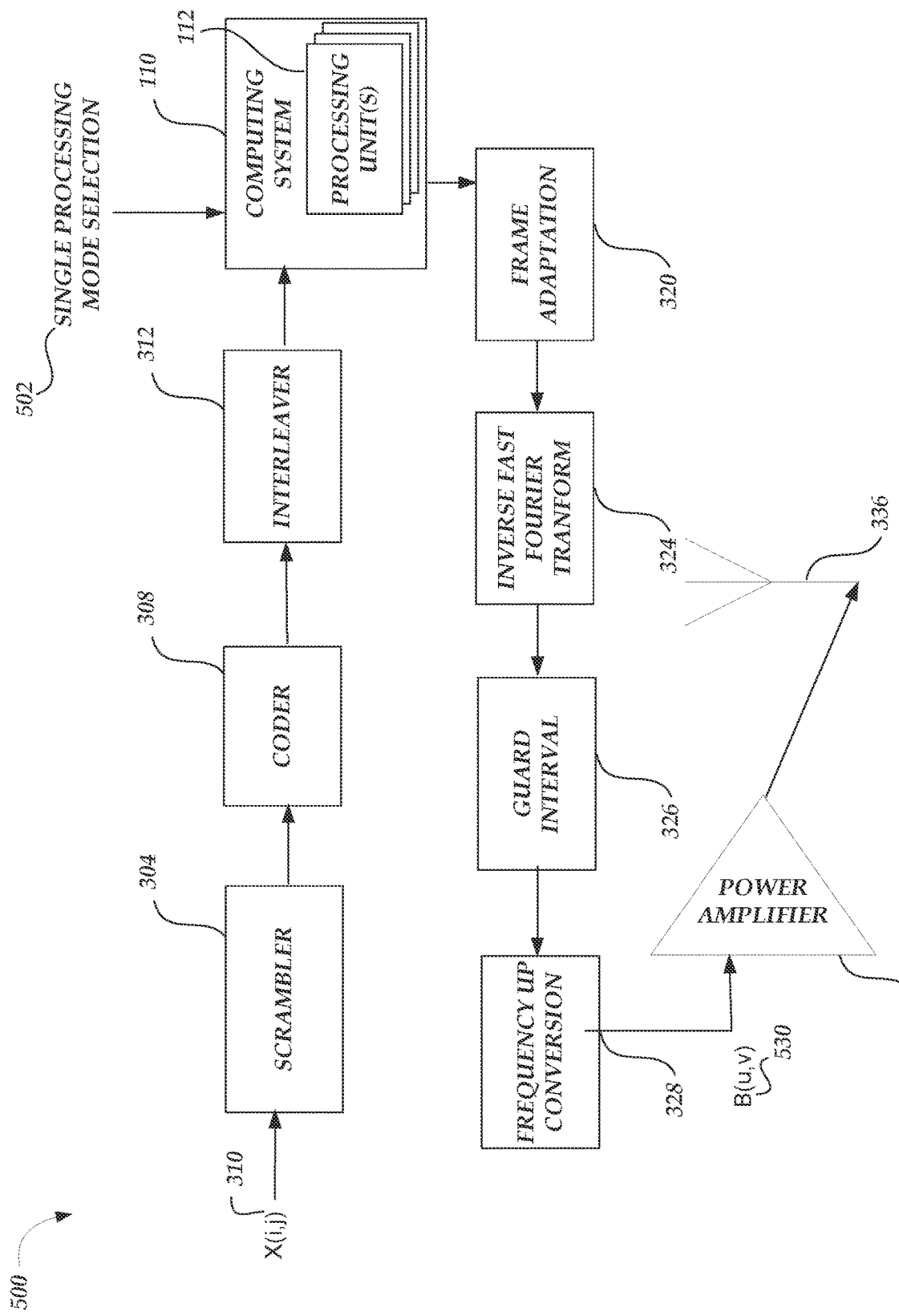
FIG. 5 is a schematic illustration of a wireless transmitter in accordance with examples described herein.

FIG. 5 is a schematic illustration of a wireless transmitter 500 in accordance with examples described herein. FIG. 5 shows a wireless transmitter that may perform several operations of an RF-front end for a wireless transmission with input data X (i,j) 310, including scrambler 304, a coder 308, an interleaver 312, a frame adaptation 320, an IFFT 324, a guard interval 326, and frequency up conversion 328. The transmitter 500 utilizes an electronic device 110 with a processing unit 112 to perform the operation of modulation mapping, such as modulation mapping 316. For example, the processing unit 112 of electronic device 110 executes instructions 115 that mix input data with coefficient data. In the example of transmitter 500, the input data (e.g., input data 210*a-c*) of the electronic device 110 may be the output of the interleaver 312; the output data (e.g., output data B(1) 230) of the electronic device 110 may be the input to the frame adaptation 320. For example, the input data of the electronic device 110 may be multiplied with the coefficient data to generate a multiplication result at multiplication unit/accumulation unit, and the multiplication result may be accumulated at that multiplication unit/accumulation unit to be further multiplied and accumulated with other portions of the input data and additional coefficients of the plurality of coefficients. For example, the processing unit 112 utilizes selected coefficient such that mixing the coefficients with input data generates output data that reflects the processing of the input data with coefficients by the circuitry of FIG. 2A, 2B, or 2C.

The electronic device 110 of the transmitter 500 may retrieve coefficient data specific to a single processing mode selection 502. As depicted in FIG. 5, the electronic device 110 may receive a single processing mode selection 502. As described herein, the single processing mode may correspond to an aspect of a wireless protocol. Accordingly, in the example of transmitter 500, the single mode processing selection 502 may correspond to the modulation mapping aspect of a wireless protocol. When such a selection 502 is received, the electronic device 110 may execute instructions for implementing a processing mode encoded in the memory 107. For example, the instructions 117, encoded at the memory 107, may include selecting a single processing mode from among multiple single processing modes, each single processing mode with respective coefficient data.

The single mode processing selection 502 may also indicate the aspect of the wireless protocol for which the electronic device 110 is to execute instructions 115 to generate output data corresponding to the operation of that aspect of the wireless protocol. As depicted, the single processing mode selection 502 indicates that the electronic device 110 is operating as a modulation mapping aspect for the wireless transmitter 500. Accordingly, the electronic device 110 may implement a modulation mapping processing mode to process the input data to retrieve coefficient data corresponding to the selection of the modulation mapping processing mode. That coefficient data may be mixed with input data to the electronic device 110 to generate output data when instructions 115 are executed.

The single processing mode selection 502 may also indicate a type of modulation mapping. For example, the modulation mapping can be associated with a modulation scheme including, but not limited to: GFDM, FBMC, UFMC, DFDM, SCMA, NOMA, MUSA, or FTN. It can be appreciated that each aspect of a wireless protocol with a corresponding single processing mode can include various types of that aspect, such as a modulation mapping processing mode having a variety of modulation schemes from which to select.

The coefficient data corresponding to the selection of the modulation mapping processing mode may be retrieved from a memory (e.g., memory 145 or a cloud-computing database). The coefficients retrieved from the memory are specific to the single processing mode selection 502. In the context of the example of transmitter 500, the single processing mode selection 502 may indicate that coefficient data specific to a modulation mapping processing mode are to be retrieved from the memory. Accordingly, the output data from the electronic device 110 in transmitter 500 may be representative of a portion of the transmission of the transmitter being processed according to the modulation processing mode selection. The electronic device 110 may output the data such the frame adaptation 320 receives the output data for further processing of the transmission.

While described above in the context of a modulation mapping processing mode, it is to be appreciated that other single processing modes are possible including, but not limited to: a fast Fourier transform (FFT) processing mode, an inverse fast Fourier transform (IFFT) processing mode, a coding mode, a Turbo coding processing mode, a decoding processing mode, a Reed Solomon processing mode, an interleaver processing mode, a deinterleaving processing mode, a demodulation mapping processing mode, a scrambling processing mode, a descrambling processing mode, a channel estimation processing mode, or combinations thereof. For example, while FIG. 5 illustrates a single processing mode selection 502 being received at an electronic device 110 to implement a modulation mapping processing mode, it is to be appreciated that an electronic device 110 may replace any of the RF operations of the wireless transmitter depicted in FIG. 5 to output data B (u,v) 530, such that the single processing mode selection 502 indicates that the electronic device 110 may implement another aspect of the wireless transmitter.

Using such an electronic device 110, the transmitter 500 may receive input data X (i,j) 310 to mix with coefficient data specific to an aspect of a wireless protocol. For example, the coefficient data may be specific to the modulation mapping aspect of a wireless protocol. The transmitter 500 may generate output data B (u,v) 530 that is representative of the input data being processed according to a wireless transmitter configured to operate with that wireless protocol, such as the wireless transmitter 300. For example, the output data B (u,v) 530 may correspond to an estimate of the B(1) 230 of FIG. 2A.

Figure 6:
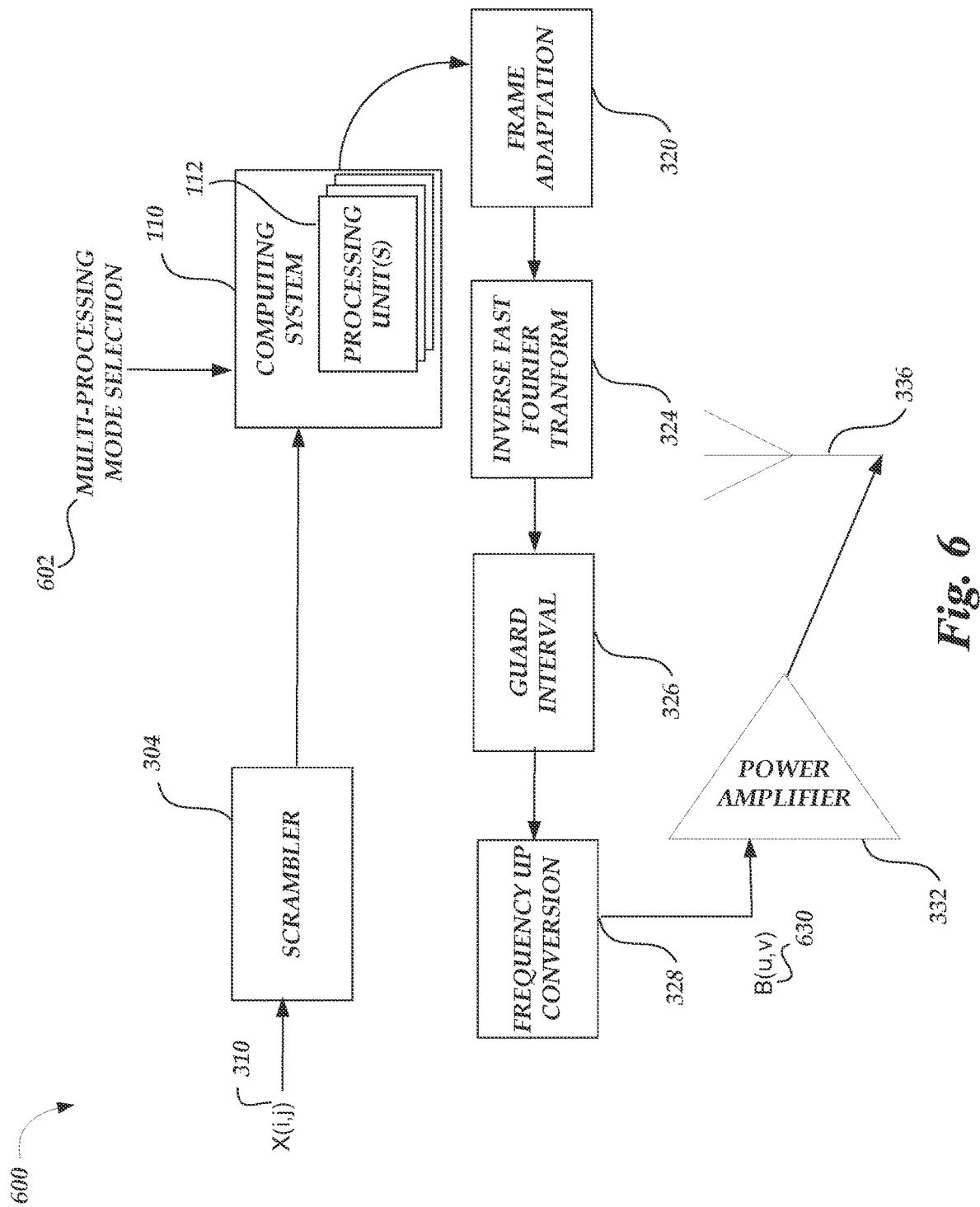
FIG. 6 is a schematic illustration of a wireless transmitter in accordance with examples described herein.

FIG. 6 is a schematic illustration of a wireless transmitter 600 in accordance with examples described herein. FIG. 6 shows a wireless transmitter that performs several operations of an RF-front end for a wireless transmission with input data X (i,j) 310, including scrambler 304, a frame adaptation 320, an IFFT 324, a guard interval 326, and frequency up conversion 328. The transmitter 600 utilizes an electronic device 110 with a processing unit 112 to perform the operation of coding, interleaving, and modulation mapping; such as coder 308, interleaver 312, and modulation mapping 316. For example, the processing unit 112 of electronic device 110 executes instructions 115 that mix input data with coefficient data. In the example of transmitter 600, the input data (e.g., input data 260a-c) of the electronic device 110 can be the output of the scrambler 304; and the output data (e.g., output data B(n) 275a-c) of the electronic device 110 can be the input to the frame adaptation 320. For example, the input data of the electronic device 110 can multiplied with the coefficient data to generate a multiplication result at multiplication unit/accumulation unit, and the multiplication result can be accumulated at that multiplication unit/accumulation unit to be further multiplied and accumulated with other portions of the input data and additional coefficients of the plurality of coefficients. Accordingly, the processing unit 112 utilizes selected coefficient such that mixing the coefficients with input data generates output data that reflects the processing of the input data with coefficients by the circuitry of FIG. 2A-2B.

The electronic device 110 of the transmitter 600 may retrieve coefficient data specific to a multi-processing mode selection 602. As depicted in FIG. 6, the electronic device 110 receives a multi-processing mode selection 602. As described herein, the multi-processing mode may correspond to at least two aspects of a wireless protocol. Accordingly, in the example of transmitter 600, the multi-processing mode selection 602 corresponds to the coding aspect, the interleaving aspect, and the modulation mapping aspect of a wireless protocol. When such a selection 602 is received, the electronic device 110 may execute instructions for implementing a processing mode encoded in the memory 107. For example, the instructions 117, encoded at the memory 107, may include selecting a multi-processing mode from among multiple multi-processing modes, each multi-processing mode with respective coefficient data.

The multi-processing mode selection 602 may also indicate the aspect of the wireless protocol for which the electronic device 110 is to execute instructions 115 to generate output data corresponding to the operation of that aspect of the wireless protocol. As depicted, the multi-processing mode selection 602 indicates that the electronic device 110 is operating as a coding, interleaving, and modulation mapping for the wireless transmitter 600. Accordingly, the electronic device 110 may implement a specific multi-processing mode to process the input data to retrieve coefficient data corresponding to the selection of that specific multi-processing mode. That coefficient data may be mixed with input data to the electronic device 110 to generate output data when instructions 115 are executed.

The multi-processing mode selection 602 may also indicate types of each aspect of the wireless protocol. For example, as described above, the modulation mapping aspect can be associated with a modulation scheme including, but not limited to: GFDM, FBMC, UFMC, DFDM, SCMA, NOMA, MUSA, or FTN. Continuing in the example, the coding aspect can be associated with a specific type of coding such as RS coding or Turbo coding. It is to be appreciated that each aspect of a wireless protocol with a corresponding multi-processing mode may include various types of that aspect.

The coefficient data corresponding to the selection of the multi-processing mode can be retrieved from a memory (e.g., memory 145 or a cloud-computing database). The coefficients retrieved from the memory may be specific to the multi-processing mode selection 602. Accordingly, the output data from the electronic device 110 in transmitter 600 may be representative of a portion of the transmission of the transmitter being processed according to the multi-processing mode selection 602. The electronic device 110 may output the data such the frame adaptation 320 receives the output data for further processing of the transmission.

While described above in the context of a specific multi-processing mode selection comprising a coding aspect, an interleaving aspect, and a modulation mapping aspect, it is to be appreciated that other multi-processing modes are possible including, but not limited to any combination of single processing modes described above. For example, while FIG. 6 illustrates a multi-processing mode selection 602 being received at an electronic device 110 to implement a coding aspect, an interleaving aspect, and a modulation mapping aspect, it can be appreciated that an electronic device 110 can replace any of the RF operations of the wireless transmitter depicted in FIG. 6 to output data B (u,v) 630, such that the single processing mode selection 602 indicates that the electronic device 110 is to implement at least two aspects of the wireless transmitter.

Using such an electronic device 110, the transmitter 600 may receive input data X (i,j) 310 to mix with coefficient data specific to at least two aspects of a wireless protocol. The transmitter 600 generates output data B (u,v) 630 that is representative of the input data being processed according to a wireless transmitter configured to operate with that wireless protocol, such as the wireless transmitter 300. For example, the output data B (u,v) 630 may correspond to an estimate of the output data B(1) 230 of FIG. 2A.

Figure 7:
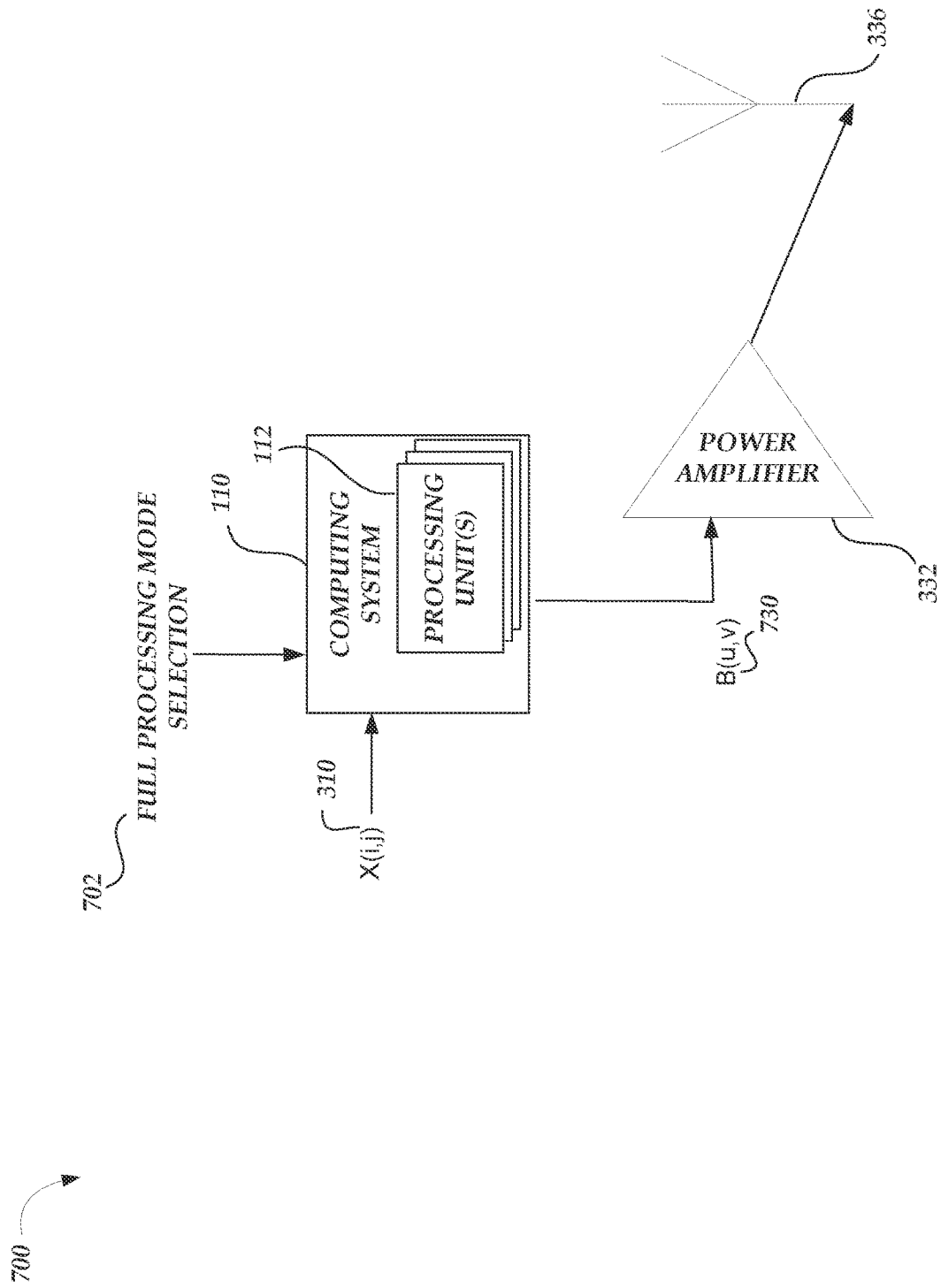
FIG. 7 is a schematic illustration of a wireless transmitter in accordance with examples described herein.

FIG. 7 is a schematic illustration of a wireless transmitter 700 in accordance with examples described herein. The wireless transmitter 700 may perform several operations of an RF-front end for a wireless transmission with input data X (i,j) 310. The transmitter 700 utilizes an electronic device 110 with a processing unit 112 to perform the operations of an RF-front end. For example, the processing unit 112 of electronic device 110 may execute instructions 115 that mix input data with coefficient data. In the example of transmitter 700, the output data (e.g., output data B(n) 275a-c) of the electronic device 110 may be the input to power amplifier 332 after processing of the input data X (i,j) 310 (e.g., input data 210a-c). For example, the input data of the electronic device 110 may be multiplied with the coefficient data to generate a multiplication result at multiplication unit/accumulation unit, and the multiplication result may be accumulated at that multiplication unit/accumulation unit to be further multiplied and accumulated with other portions of the input data and additional coefficients of the plurality of coefficients. For example, the processing unit 112 utilizes selected coefficient such that mixing the coefficients with input data generates output data that reflects the processing of the input data with coefficients by the circuitry of FIG. 2A, 2B, or 2C.

The electronic device 110 of the transmitter 700 may retrieve coefficient data specific to a full processing mode selection 702. As depicted in FIG. 7, the electronic device 110 may receive a multi-processing mode selection 702. As described herein, the full processing a full processing mode may be a processing mode representative of a wireless transmitter (e.g., a wireless transmitter processing mode) or a processing mode representative of a wireless receiver (e.g., a wireless receiver processing mode). Accordingly, in the example of transmitter 700, the full processing mode selection 702 may correspond to the wireless transmitter processing mode that may implement any aspects of a specific wireless protocol required for a wireless transmitter to implement that protocol. Similarly, a wireless receiver processing mode may implement any aspects of a specific wireless protocol required for a wireless receiver to implement that protocol. When such a selection 702 is received, the electronic device 110 may execute instructions 117 for implementing a processing mode encoded in the computer readable media. For example, the instructions 117 may include selecting a full processing mode from among multiple full processing mode, each full processing mode with respective coefficient data.

The full processing mode selection 702 may indicate the wireless protocol for which the electronic device 110 is to execute instructions 115 to generate output data corresponding to the operation of that the wireless protocol as wireless transmitter. For example, the full processing mode selection 702 may indicate that the wireless transmitter is to implement a 5G wireless protocol that includes a FBMC modulation scheme. Accordingly, the electronic device 110 may implement a specific full processing mode to process the input data to retrieve coefficient data corresponding to the selection of that specific full processing mode. That coefficient data can be mixed with input data to the electronic device 110 to generate output data when instructions 115 are executed.

The coefficient data corresponding to the selection of the full processing mode may be retrieved from a memory (e.g., memory 145 or a cloud-computing database). The coefficients retrieved from the memory are specific to the full processing mode selection 702. Accordingly, the output data from the electronic device 110 in transmitter 700 may be representative of the transmission being processed according to the full processing mode selection 702.

Using such an electronic device 110, the transmitter 700 may receive input data X (i,j) 310 to mix with coefficient data specific to a full processing mode of a wireless protocol. The transmitter 700 may generate output data B (u,v) 730 that is representative of the input data being processed according to a wireless transmitter configured to operate with that wireless protocol, such as the wireless transmitter 300. For example, the output data B (u,v) 730 may correspond to an estimate of the output data B(1) 230 of FIG. 2A.

In some examples, the wireless transmitter mode may include the operations of a digital baseband processing, an RF front-end, and any fronthaul processing such as compression or estimation. As an example of fronthaul processing, the electronic device 110 may operate in a Cloud-Radio Access Network (C-RAN) where wireless base station functionality is divided between remote radio heads (RRHs) and baseband units (BBUs). An RRH may perform RF amplification, up/down conversion, filtering, ADC, or DAC to provide a baseband signal to a BBU. A BBU can process the baseband signals and optimize resource allocation among the RRHs. A fronthaul can be the link between an RRH and a BBU that may perform compression of the baseband signal to send the signal to BBU and that may additionally perform estimation of the fronthaul link to compensate for any effects the fronthaul has on the baseband signal during transmission to the BBU. In such examples, an electronic device 110 may operate as either a RRH, a fronthaul, a BBU, or any combination thereof by executing instructions 115 that mix input data with coefficient data and/or executing instructions to implement a processing mode, such as an RRH processing mode, a fronthaul processing mode, or a BBU processing mode.

To train a computing device to generate coefficient data with the output data B (u,v) 730, a wireless transmitter may receive the input associated with a RF wireless transmission. Then, the wireless transmitter may perform operations as an RF front-end according to a wireless protocol, such as modulating the input data for a RF wireless transmission. The output data that is generated by the wireless transmitter can be compared to the input data to generate coefficient data. For example, the comparison can involve a minimization function that optimizes coefficients. A minimization function analyzes each combination of input samples and test vectors to determine the minimum quantity, which may reflect a minimized error of the difference between the two outputs. The coefficients utilized to generate that minimized quantity reflect the least error estimation of the output from the specifically-designed wireless transmitter. Accordingly, an electronic device 110 may be trained to generate coefficient data based on the operations of the wireless transmitter such that mixing arbitrary input data (e.g., test vectors) using the coefficient data generates an approximation of the output data, as if it were processed by the specifically-designed wireless transmitter. The coefficient data may also be stored in a coefficient database (e.g., memory 145), with each set of coefficient data corresponding to a particular wireless protocol that may be utilized in the RF domain for a data transmission. In some examples, an input test vector and an output test vector that emulates the processing of a wireless transmitter can be used to generate the coefficient data.

While some examples herein having a single-processing mode selection (e.g., as depicted in FIG. 5), multi-processing mode selection (e.g., as depicted in FIG. 6), and full processing mode selection (e.g., as depicted in FIG. 7) have been described in the context of a wireless transmitter, in some examples the processing modes may be implemented, as executed by instructions 117 for implementing a wireless processing mode, in a wireless receiver, such as the wireless receiver 400 of FIG. 4, with corresponding aspects of a wireless protocol being implemented by an electronic device 110 with processing unit(s) 112. For example, a computing system may receive wireless input data from an antenna 404 with an electronic device 110 implementing a wireless receiver processing mode, as indicated by a full processing mode selection indicating a wireless receiver processing mode. Accordingly, any aspect of a wireless transmitter or a wireless receiver, whether a single aspect, multi-aspect, or full implementation, may be implemented by an electronic device 110 with processing unit(s) 112 implementing instructions 115 for mixing input data with coefficient data and instructions 117 for implementing a processing mode. Similarly, an electronic device 110 may be trained with coefficient data generated from a wireless receiver configured to operate in accordance with a wireless protocol. For example, the output data that is generated by the wireless receiver (or any aspect of a wireless receiver) may be compared to the input data to generate coefficient data.

Additionally or alternatively, any processing mode selection may indicate types of each aspect of the wireless protocol. For example, a modulation mapping aspect may be associated with a modulation scheme including, but not limited to: GFDM, FBMC, UFMC, DFDM, SCMA, NOMA, MUSA, or FTN. Each aspect of a wireless protocol with a corresponding processing mode may include various types of that aspect. For example, the full processing mode selection 702 may indicate an aspect for up conversion to a 5G wireless frequency range, such as utilizing a carrier frequency in the E-band (e.g., 71-76 GHz and 81-86 GHz), a 28 GHz Millimeter Wave (mmWave) band, or a 60 GHz V-band (e.g., implementing a 802.11 ad protocol). In some examples, the full processing mode selection 702 may also indicate whether a MIMO implementation is to be utilized, for example, the selection 702 may indicate that a 2×2 spatial stream may be utilized.

Figure 8:
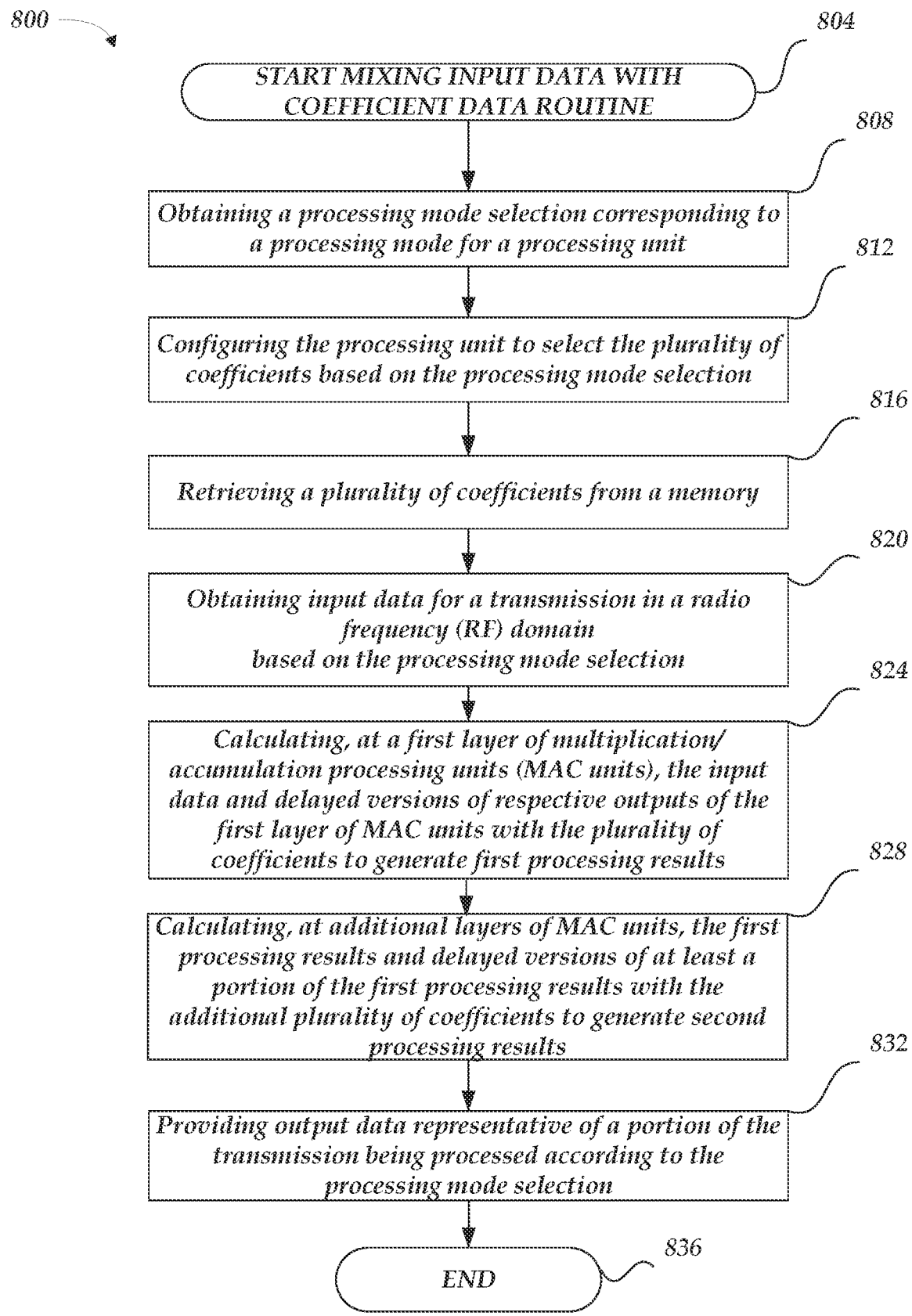
FIG. 8 is a flowchart of a method arranged in accordance with examples described herein.

FIG. 8 is a flowchart of a method 800 in accordance with examples described herein. Example method 800 may be implemented using, for example, system 100 in FIG. 1A, system 200 in FIG. 2A, system 250 in FIG. 2B, system 280 in FIG. 2C, or any system or combination of the systems depicted in FIG. 3-7 or FIG. 10-11 described herein. In some examples, the blocks in example method 800 may be performed by a computing device such as an electronic device 110 of FIG. 1A and/or in conjunction with a processing unit, such as processing unit 112 of FIG. 2A, 2B, or 2C. The operations described in blocks 804-836 may also be stored as computer-executable instructions in a computer-readable medium such as the mode configurable control 105, storing the executable instructions 115.

Example method 800 may begin with a block 804 that starts execution of the mixing input data with coefficient data routine. The method may include a block 808 that recites "obtaining a processing mode selection corresponding to a processing mode for a processing unit." As described herein, the processing mode selection may be obtained as a selection from a touchscreen of a computing device that communicates with the electronic device 110. Processing mode selections may be obtained from any computing device that can receive user input regarding processing mode selections. Block 808 may be followed by block 812 that recites "configuring the processing unit to select the plurality of coefficients based on the processing mode selection." As described herein, configuring the processing unit may include configuring the processing unit for various processing modes depending on the processing mode selection. Configuring the processing unit may include configuring the processing unit for various modes, including a single processing mode, a multi-processing mode, and a full processing mode. For example, a computing system may operate in single-processing mode as a Turbo coding operation to output data according to data being encoded with the Turbo coding operation.

Block 812 may be followed by block 816 that recites "retrieving a plurality of coefficients from a memory." As described herein, the processing unit may retrieve coefficients for mixing with input data; for example, utilizing a memory look-up unit. For example, the memory may store (e.g., in a database) associations between coefficients and wireless protocols and/or processing modes described herein. For example, the processing unit may request the coefficients from a memory part of the implementing computing device, from a memory part of an external computing device, or from a memory implemented in a cloud-computing device. In turn, the plurality of coefficients may be retrieved from the memory as requested by the processing unit.

Block 816 may be followed by block 820 that recites "obtaining input data for a transmission in a radio frequency (RF) domain based on the processing mode selection." As described herein, the processing unit may be configured to obtain a variety of types of input data, such as a data bit stream, coded bits, modulated symbols, and the like that may be transmitted or received by a wireless transmitter or wireless receiver respectively. In an example, the processing unit, in a single processing mode, may implement the functionality of an operation of a portion of the wireless transmitter or receiver. In the example of the Turbo coding operation, the processing unit may obtain a data bit stream to be coded, including an indication regarding a parameter of the Turbo coding operation. In an example of an IFFT operation, the processing unit may obtain a data bit stream to be transformed to frequency-domain, including an indication regarding a parameter of the IFFT operation, such as the point size for the IFFT operation to utilize. In an example of a multi-processing mode operation of DAC, the input data may be digital data to be converted to analog data for transmitting at an antenna of a wireless transmitter. In some examples, a parameter regarding an aspect of an operation may be obtained in the processing mode selection. For example, the parameter of the IFFT operation, such as the point size for the IFFT operation, may be obtained as information included in a single-processing mode selection, a multi-processing mode selection, or a full processing mode selection.

Block 820 may be followed by block 824 that recites "calculating, at a first layer of multiplication/accumulation processing units (MAC units), the input data and delayed versions of respective outputs of the first layer of MAC units with the plurality of coefficients to generate first processing results." As described herein, the processing unit utilizes the plurality of coefficients such that mixing the coefficients with input data and delayed versions of respective outputs of the first layer of MAC units generates output data that reflects the processing of the input data with coefficients by the circuitry of FIG. 2A, 2B, or 2C. For example, various ALUs in an integrated circuit may be configured to operate as the circuitry of FIG. 2A, 2B, or 2C, thereby mixing the input data and delayed versions of respective outputs of the first layer of MAC units with the coefficients as described herein. For example, with reference to FIG. 2A, the input data and delayed versions of respective outputs of the first layer of MAC units may be calculated with the plurality of coefficients to generate first processing results, at a first layer of multiplication/accumulation processing units (MAC units). In some examples, various hardware platforms may implement the circuitry of FIG. 2A, 2B, or 2C, such as an ASIC, a DSP implemented as part of a FPGA, or a system-on-chip.

Block 824 may be followed by block 828 that recites "calculating, at additional layers of MAC units, the first processing results and delayed versions of at least a portion of the first processing results with the additional plurality of coefficients to generate second processing results." As described herein, the processing unit utilizes additional plurality of coefficients such that mixing the coefficients with certain processing results and delayed versions of at least a portion of those certain processing results generates output data that reflects the processing of the input data with coefficients by the circuitry of FIG. 2A, 2B, or 2C. For example, with reference to FIG. 2A, the processing results of the first layer (e.g., multiplication processing results) and delayed versions of at least a portion of those processing results may be calculated with the additional plurality of coefficients to generate second processing results, at a second layer of multiplication/accumulation processing units (MAC units). The processing results of the second layer may be calculated with an additional plurality of coefficients to generate the output data B(1) 230.

Block 828 may be followed by block 832 that recites "providing output data representative of a portion of the transmission being processed according to the processing mode selection." As described herein, the output data may be provided to another portion of specifically-designed hardware such as another portion of a wireless transmitter or receiver, or an antenna for wireless, RF transmission. In an example of a full processing mode selection, the output data may be provided to an application requesting the output data from a wireless endpoint, such that the output data was provided to the application as part of a processing unit implementing a wireless receiver. Block 832 may be followed by block 836 that ends the example method 800. In some examples, the blocks 808 and 812 may be optional blocks.

Figure 9:
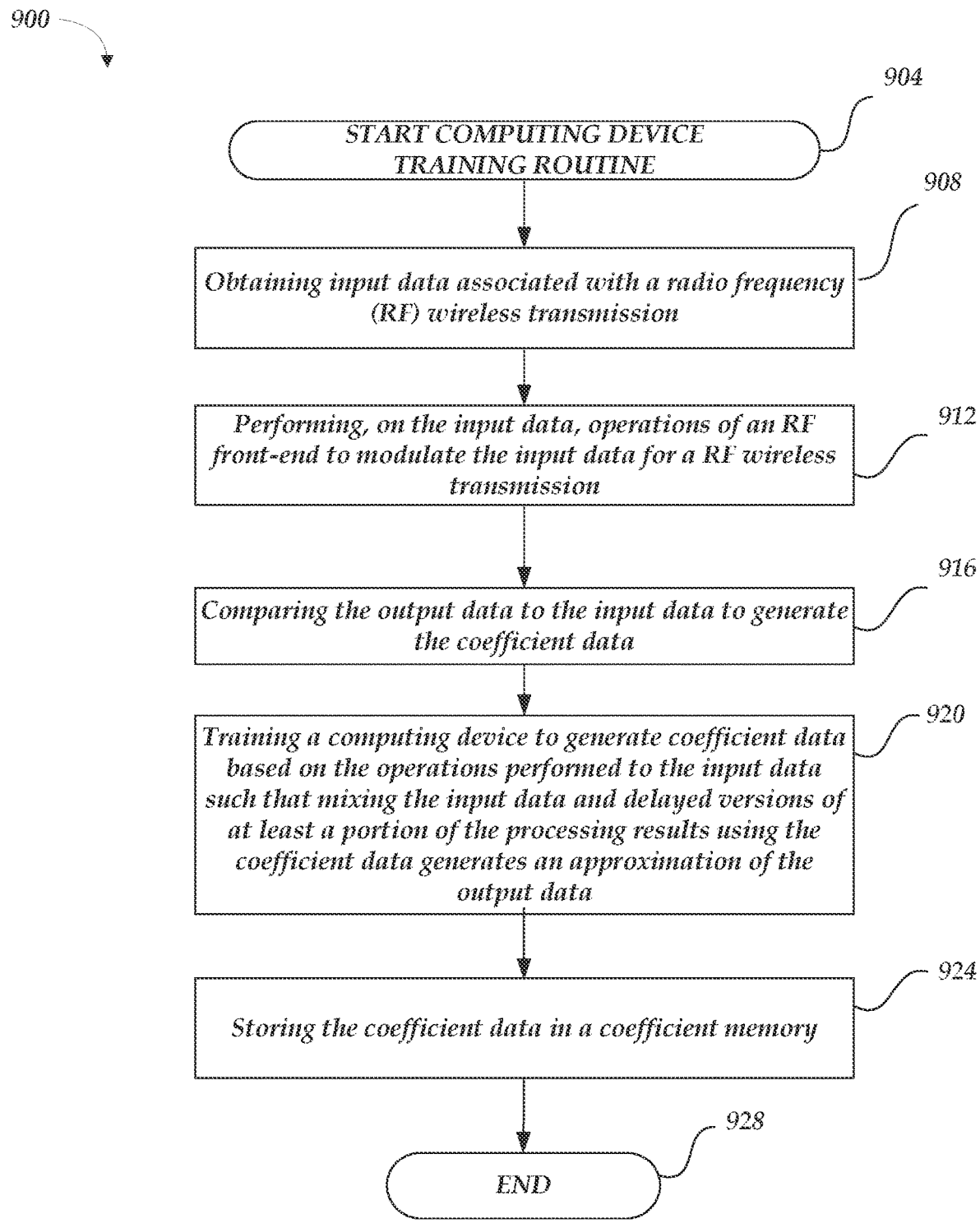
FIG. 9 is a flowchart of a method arranged in accordance with examples described herein.

FIG. 9 is a flowchart of a method 900 in accordance with examples described herein. Example method 900 may be implemented using, for example, system 100 in FIG. 1A, system 200 in FIG. 2A, system 250 in FIG. 2B, system 280 in FIG. 2C, or any system or combination of the systems depicted in FIG. 3-7 or FIS. 10-11 described herein. In some examples, the blocks in example method 900 may be performed by a computing device such as an electronic device 110 of FIG. 1A and/or in conjunction with a processing unit 112 of FIG. 2A, 2B, or 2C. The operations described in blocks 904-928 may also be stored as computer-executable instructions in a computer-readable medium such as the mode configurable control 105, storing the executable instructions 115, or the memory 107, storing the executable instructions 117.

Example method 900 may begin with a block 904 that starts execution of the mixing input data with coefficient data routine. The method may begin with a block 908 that recites "obtaining input data associated with a radio frequency (RF) wireless transmission." As described herein, the processing unit may be configured to obtain a variety of types of input data, such as a data bit stream, coded bits, modulated symbols, and the like that may be transmitted or received by a wireless transmitter or wireless receiver respectively. In an example, the processing unit, in a single processing mode, may implement the functionality of an operation of a portion of the wireless transmitter or receiver. In the example of the Turbo coding operation, the processing unit may obtain a data bit stream to be coded, including an indication regarding a parameter of the Turbo coding operation. In an example of an IFFT operation, the processing unit may obtain a data bit stream to be transformed to frequency-domain, including an indication regarding a parameter of the IFFT operation, such as the point size for the IFFT operation to utilize. In an example of a multi-processing mode operation of DAC, the input data may be digital data to be converted to analog data for transmitting at an antenna of a wireless transmitter. In some examples, a parameter regarding an aspect of an operation may be received in the processing mode selection. For example, the parameter of the IFFT operation, such as the point size for the IFFT operation, may be obtained as information included in a single-processing mode selection, a multi-processing mode selection, or a full processing mode selection.

Block 908 may be followed by block 912 that recites "performing, on the input data, operations of an RF front-end to modulate the input data for a RF wireless transmission." As described herein, a specifically-designed wireless transmitter may perform RF front-end operations, such as scrambling, coding, interleaving, modulation mapping, frequency up-conversion, and the like described above to transmit the input data as an RF wireless transmission. In an example, a specifically-designed wireless transmitter may perform only a portion of the RF front-end operations to train a computing device for a specific operation of the wireless transmitter, such that the coefficient data generated by the computing device may be utilized in a single processing mode or a multi-processing mode.

Block 912 may be followed by block 916 that recites "comparing the output data to the input data to generate the coefficient data." As described herein, a computing device may compare the output data from the specifically-designed wireless transmitter to output data generated from a processing unit of the computing device implementing the operation of the wireless transmitter. For example, the computing device may use a least error p-norm comparison, as part of a minimization function, between the two outputs to determine whether the coefficient data represents an estimation of the specifically-designed wireless transmitter. In an example, the computing device may use a least squares error function, as part of an optimization problem, between the two outputs to determine whether the coefficient data represents an estimation of the specifically-designed wireless transmitter.

As an example of such comparing, the processing units 112 of FIG. 2A, 2B, or 2C may be referred to as neurons, with several of like processing units 112 operating as a neural network. With such processing units 112 of FIG. 2A operating as neurons, the processing unit 112 may receive observation vectors Y(n) as the input data 210a-c. For example, the observation vectors may be denoted as:

$$Y(n)=[y(n),y(n-1),\ldots y(n-m+1)]$$

And the coefficients stored in the memory 145 may be referred to as connection weights that may be randomly initialized to certain values, such that for the MLUs of FIG. 2A, the coefficients retrieved may be represented as:

$$W_{ij}^{(1)}(0) \text{ and } W_{j1}^{(2)}(0)(\text{for } i=1,2,\ldots m;j=1,2,\ldots M)$$

where m represents a number of antennas or wireless channels, and where M represents a number of layers. In providing such observation vectors as inputs and connection weights as coefficients, an electronic device implementing such processing units may compare the output data generated from the processing unit to obtain trained coefficient data, or connection weights.

Block 916 may be followed by block 920 that recites "training a computing device to generate coefficient data based on the operations performed to the input data such that mixing the input data and delayed versions of at least a portion of the first processing results using the coefficient data generates an approximation of the output data." As described herein, the computing device may compare the output data from the specifically-designed wireless transmitter to output data generated from a processing unit of the computing device implementing the operation of the wireless transmitter across a variety of test vectors and input samples to train the computing device to determine a minimized error. For example, the minimized error, trained across various input samples and test vectors may represent the optimized estimation of the processing of the input data in the specifically-designed hardware. In an example, training the computing device according to input samples and test vectors may be referred to as supervised learning of the computing device to generate coefficient data. In various examples, the computing device may also be trained to generate coefficient data according to unsupervised learning. For example, the computing device may monitor output of the specifically-designed hardware to learn which coefficient data may minimize the error of a processing unit of the computing device implementing the operation of the wireless transmitter.

Continuing in the example of the observation vectors and the connection weights, the processing unit 112 may iterate the comparing of output data generated to input data such that the connection weights are updated in each iteration to minimize the error of in the output of a neuron (e.g., the output B(1) 230). The connection weights, in being multiplied and accumulated with such observation vectors as Y(n), may be updated in accordance with Equation (19):

$$W_{ij}^{(1)}(t+1)=W_{ij}^{(1)}(t)+\alpha\Sigma_{n=m}^{N+M-1}\delta_j^{(1)}(n)y(n-i+1) \qquad (19)$$

In Equation (19), α is the learning rate at which the processing unit 112 may learn from the output data, and thereby calculate updated connection weights. Further, the term, $\delta_j^{(1)}(n)$, may refer to an error term that is propagated to the next set of connection weights to be updated. For example, the error term may a minimized error with respect to a p-norm calculated that compares the output data B(1) 230 to certain input data 210a-c. Or, with respect to the example of FIG. 2B, the error term may be a minimized error with respect to a p-norm calculated that compares the output data B(n) 275a-c to certain input data 260a-c. Accordingly, using Equation (19), coefficient data may be generated that represents a minimized error between output data and input data. Accordingly, in training the computing device to generate coefficient data based on the operations performed to the input data such that mixing the input data using the coefficient data generates an approximation of the output data, any number of pluralities of coefficient data may be generated that may utilized by the systems disclosed herein, for example, the systems of FIG. 3-7 or 10-11.

Block 920 may be followed by block 924 that recites "storing the coefficient data in a coefficient memory." As described herein, the computing device may store the coefficients in a memory, such as a memory database. For example, the memory may store associations between coefficients and wireless protocols and/or processing mode, as trained by the computing device. For example, the computing device may store the coefficients in a memory part of the computing device itself, in a memory of an external computing device, or in a memory implemented in a cloud-computing device. Block 924 is followed by the block 928 that ends the example method 900. In some examples, the block 924 may be an optional block.

The blocks included in the described example methods 800 and 900 are for illustration purposes. In some embodiments, the blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc.

Figure 10:
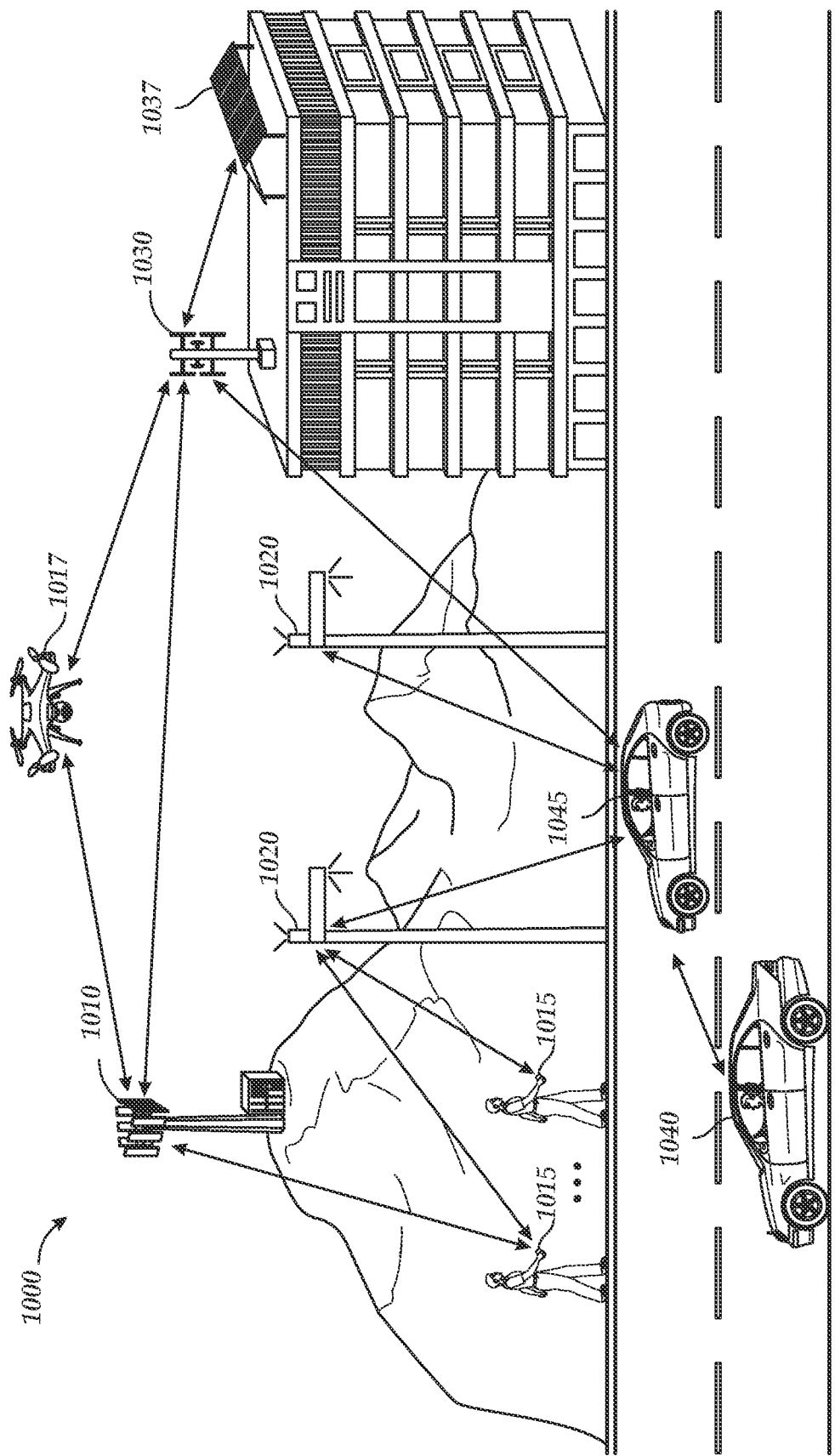
FIG. 10 is a schematic illustration of a wireless communications system arranged in accordance with aspects of the present disclosure.

FIG. 10 illustrates an example of a wireless communications system 1000 in accordance with aspects of the present disclosure. The wireless communications system 1000 includes a base station 1010, a mobile device 1015, a drone 1017, a small cell 1030, and vehicles 1040, 1045. The base station 1010 and small cell 1030 may be connected to a network that provides access to the Internet and traditional communication links. The system 1000 may facilitate a wide-range of wireless communications connections in a 5G system that may include various frequency bands, including but not limited to: a sub-6 GHz band (e.g., 700 MHz communication frequency), mid-range communication bands (e.g., 2.4 GHz), mmWave bands (e.g., 24 GHz), and a NR band (e.g., 3.5 GHz).

Additionally or alternatively, the wireless communications connections may support various modulation schemes, including but not limited to: filter bank multi-carrier (FBMC), the generalized frequency division multiplexing (GFDM), universal filtered multi-carrier (UFMC) transmission, bi-orthogonal frequency division multiplexing (BFDM), sparse code multiple access (SCMA), non-orthogonal multiple access (NOMA), multi-user shared access (MUSA), and faster-than-Nyquist (FTN) signaling with time-frequency packing. Such frequency bands and modulation techniques may be a part of a standards framework, such as Long Term Evolution (LTE) (e.g., 1.8 GHz band) or other technical specification published by an organization like 3GPP or IEEE, which may include various specifications for subcarrier frequency ranges, a number of subcarriers, uplink/downlink transmission speeds, TDD/FDD, and/or other aspects of wireless communication protocols.

The system 1000 may depict aspects of a radio access network (RAN), and system 1000 may be in communication with or include a core network (not shown). The core network may include one or more serving gateways, mobility management entities, home subscriber servers, and packet data gateways. The core network may facilitate user and control plane links to mobile devices via the RAN, and it may be an interface to an external network (e.g., the Internet). Base stations 1010, communication devices 1020, and small cells 930 may be coupled with the core network or with one another, or both, via wired or wireless backhaul links (e.g., S1 interface, X2 interface, etc.).

The system 1000 may provide communication links connected to devices or "things," such as sensor devices, e.g., solar cells 1037, to provide an Internet of Things ("IoT") framework. Connected things within the IoT may operate within frequency bands licensed to and controlled by cellular network service providers, or such devices or things may. Such frequency bands and operation may be referred to as narrowband IoT (NB-IoT) because the frequency bands allocated for IoT operation may be small or narrow relative to the overall system bandwidth. Frequency bands allocated for NB-IoT may have bandwidths of 1, 5, 10, or 20 MHz, for example.

Additionally or alternatively, the IoT may include devices or things operating at different frequencies than traditional cellular technology to facilitate use of the wireless spectrum. For example, an IoT framework may allow multiple devices in system 1000 to operate at a sub-6 GHz band or other industrial, scientific, and medical (ISM) radio bands where devices may operate on a shared spectrum for unlicensed uses. The sub-6 GHz band may also be characterized as and may also be characterized as an NB-IoT band. For example, in operating at low frequency ranges, devices providing sensor data for "things," such as solar cells 1037, may utilize less energy, resulting in power-efficiency and may utilize less complex signaling frameworks, such that devices may transmit asynchronously on that sub-6 GHz band. The sub-6 GHz band may support a wide variety of uses case, including the communication of sensor data from various sensors devices. Examples of sensor devices include sensors for detecting energy, heat, light, vibration, biological signals (e.g., pulse, EEG, EKG, heart rate, respiratory rate, blood pressure), distance, speed, acceleration, or combinations thereof. Sensor devices may be deployed on buildings, individuals, and/or in other locations in the environment. The sensor devices may communicate with one another and with computing systems which may aggregate and/or analyze the data provided from one or multiple sensor devices in the environment.

In such a 5G framework, devices may perform functionalities performed by base stations in other mobile networks (e.g., UMTS or LTE), such as forming a connection or managing mobility operations between nodes (e.g., handoff or reselection). For example, mobile device 1015 may receive sensor data from the user utilizing the mobile device 1015, such as blood pressure data, and may transmit that sensor data on a narrowband IoT frequency band to base station 1010. In such an example, some parameters for the determination by the mobile device 1015 may include availability of licensed spectrum, availability of unlicensed spectrum, and/or time-sensitive nature of sensor data. Continuing in the example, mobile device 1015 may transmit the blood pressure data because a narrowband IoT band is available and can transmit the sensor data quickly, identifying a time-sensitive component to the blood pressure (e.g., if the blood pressure measurement is dangerously high or low, such as systolic blood pressure is three standard deviations from norm).

Additionally or alternatively, mobile device 1015 may form device-to-device (D2D) connections with other mobile devices or other elements of the system 1000. For example, the mobile device 1015 may form RFID, WiFi, MultiFire, Bluetooth, or Zigbee connections with other devices, including communication device 1020 or vehicle 1045. In some examples, D2D connections may be made using licensed spectrum bands, and such connections may be managed by a cellular network or service provider. Accordingly, while the above example was described in the context of narrowband IoT, it can be appreciated that other device-to-device connections may be utilized by mobile device 1015 to provide information (e.g., sensor data) collected on different frequency bands than a frequency band determined by mobile device 1015 for transmission of that information.

Moreover, some communication devices may facilitate ad-hoc networks, for example, a network being formed with communication devices 1020 attached to stationary objects and the vehicles 1040, 1045, without a traditional connection to a base station 1010 and/or a core network necessarily being formed. Other stationary objects may be used to support communication devices 1020, such as, but not limited to, trees, plants, posts, buildings, blimps, dirigibles, balloons, street signs, mailboxes, or combinations thereof. In such a system 1000, communication devices 1020 and small cell 1030 (e.g., a small cell, femtocell, WLAN access point, cellular hotspot, etc.) may be mounted upon or adhered to another structure, such as lampposts and buildings to facilitate the formation of ad-hoc networks and other IoT-based networks. Such networks may operate at different frequency bands than existing technologies, such as mobile device 1015 communicating with base station 1010 on a cellular communication band.

The communication devices 1020 may form wireless networks, operating in either a hierarchal or ad-hoc network fashion, depending, in part, on the connection to another element of the system 1000. For example, the communication devices 1020 may utilize a 700 MHz communication frequency to form a connection with the mobile device 1015 in an unlicensed spectrum, while utilizing a licensed spectrum communication frequency to form another connection with the vehicle 1045. Communication devices 1020 may communicate with vehicle 1045 on a licensed spectrum to provide direct access for time-sensitive data, for example, data for an autonomous driving capability of the vehicle 1045 on a 5.9 GHz band of Dedicated Short Range Communications (DSRC).

Vehicles 1040 and 1045 may form an ad-hoc network at a different frequency band than the connection between the communication device 1020 and the vehicle 1045. For example, for a high bandwidth connection to provide time-sensitive data between vehicles 1040, 1045, a 24 GHz mmWave band may be utilized for transmissions of data between vehicles 1040, 1045. For example, vehicles 1040, 1045 may share real-time directional and navigation data with each other over the connection while the vehicles 1040, 1045 pass each other across a narrow intersection line. Each vehicle 1040, 1045 may be tracking the intersection line and providing image data to an image processing algorithm to facilitate autonomous navigation of each vehicle while each travels along the intersection line. In some examples, this real-time data may also be substantially simultaneously shared over an exclusive, licensed spectrum connection between the communication device 1020 and the vehicle 1045, for example, for processing of image data received at both vehicle 1045 and vehicle 1040, as transmitted by the vehicle 1040 to vehicle 1045 over the 24 GHz mmWave band. While shown as automobiles in FIG. 10, other vehicles may be used including, but not limited to, aircraft, spacecraft, balloons, blimps, dirigibles, trains, submarines, boats, ferries, cruise ships, helicopters, motorcycles, bicycles, drones, or combinations thereof.

While communication device 1020 may utilize stationary objects to support and estimate input data received at such devices, signals transmitted to/from vehicles 1040 and 1045 may experience a time-varying wireless channel due to time-varying objects in the paths of signals to/from vehicles 1040 and 1045, such as objects in the roadway, pedestrians, or other vehicles and/or moving objects. Advantageously, utilizing the processing units 112 depicted in FIGS. 2A-2C, the time-varying nature of moving objects can be better estimated by inferential recurrent neural networks that are trained to process RF signals in such time-varying wireless channels. For example, when receiving noisy wireless input data and mixing such input data with delayed versions of processing results, vehicles 1040 and 1045 may more efficiently process and compensate the effects of time-varying objects in the path of vehicles 1040 and 1045. For example, while one frequency band of the vehicle 1040 may operate on an ultrawideband (UWB) range for detection of near objects and such effects may be compensated independently from another frequency band being received on the 24 GHz mmWave band or even a cellular band. The time-varying objects may affect the frequencies of each band with varying effects, such that each frequency band may be processed independently, but also compensated according to the time-varying effects of that respective frequency using the recurrent neural networks described herein.

While described in the context of a 24 GHz mmWave band, it can be appreciated that connections may be formed in the system 1000 in other mmWave bands or other frequency bands, such as 28 GHz, 37 GHz, 38 GHz, 39 GHz, which may be licensed or unlicensed bands. In some cases, vehicles 1040, 1045 may share the frequency band that they are communicating on with other vehicles in a different network. For example, a fleet of vehicles may pass vehicle 1040 and, temporarily, share the 24 GHz mmWave band to form connections among that fleet, in addition to the 24 GHz mmWave connection between vehicles 1040, 1045. As another example, communication device 1020 may substantially simultaneously maintain a 700 MHz connection with the mobile device 1015 operated by a user (e.g., a pedestrian walking along the street) to provide information regarding a location of the user to the vehicle 1045 over the 5.9 GHz band. In providing such information, communication device 1020 may leverage antenna diversity schemes as part of a massive MIMO framework to facilitate time-sensitive, separate connections with both the mobile device 1015 and the vehicle 1045. A massive MIMO framework may involve a transmitting and/or receiving devices with a large number of antennas (e.g., 12, 20, 64, 128, etc.), which may facilitate precise beamforming or spatial diversity unattainable with devices operating with fewer antennas according to legacy protocols (e.g., WiFi or LTE).

The base station 1010 and small cell 1030 may wirelessly communicate with devices in the system 1000 or other communication-capable devices in the system 1000 having at the least a sensor wireless network, such as solar cells 1037 that may operate on an active/sleep cycle, and/or one or more other sensor devices. The base station 1010 may provide wireless communications coverage for devices that enter its coverages area, such as the mobile device 1015 and the drone 1017. The small cell 1030 may provide wireless communications coverage for devices that enter its coverage area, such as near the building that the small cell 1030 is mounted upon, such as vehicle 1045 and drone 1017.

Generally, a small cell 1030 may be referred to as a small cell and provide coverage for a local geographic region, for example, coverage of 200 meters or less in some examples. This may contrast with at macrocell, which may provide coverage over a wide or large area on the order of several square miles or kilometers. In some examples, a small cell 1030 may be deployed (e.g., mounted on a building) within some coverage areas of a base station 1010 (e.g., a macrocell) where wireless communications traffic may be dense according to a traffic analysis of that coverage area. For example, a small cell 1030 may be deployed on the building in FIG. 10 in the coverage area of the base station 1010 if the base station 1010 generally receives and/or transmits a higher amount of wireless communication transmissions than other coverage areas of that base station 1010. A base station 1010 may be deployed in a geographic area to provide wireless coverage for portions of that geographic area. As wireless communications traffic becomes more dense, additional base stations 1010 may be deployed in certain areas, which may alter the coverage area of an existing base station 1010, or other support stations may be deployed, such as a small cell 1030. Small cell 1030 may be a femtocell, which may provide coverage for an area smaller than a small cell (e.g., 100 meters or less in some examples (e.g., one story of a building)).

While base station 1010 and small cell 1030 may provide communication coverage for a portion of the geographical area surrounding their respective areas, both may change aspects of their coverage to facilitate faster wireless connections for certain devices. For example, the small cell 1030 may primarily provide coverage for devices surrounding or in the building upon which the small cell 1030 is mounted. However, the small cell 1030 may also detect that a device has entered is coverage area and adjust its coverage area to facilitate a faster connection to that device.

For example, a small cell 1030 may support a massive MIMO connection with the drone 1017, which may also be referred to as an unmanned aerial vehicle (UAV), and, when the vehicle 1045 enters it coverage area, the small cell 1030 adjusts some antennas to point directionally in a direction of the vehicle 1045, rather than the drone 1017, to facilitate a massive MIMO connection with the vehicle, in addition to the drone 1017. In adjusting some of the antennas, the small cell 1030 may not support as fast as a connection to the drone 1017 at a certain frequency, as it had before the adjustment. For example, the small cell 1030 may be communicating with the drone 1017 on a first frequency of various possible frequencies in a 4G LTE band of 1.8 GHz. However, the drone 1017 may also request a connection at a different frequency with another device (e.g., base station 1010) in its coverage area that may facilitate a similar connection as described with reference to the small cell 1030, or a different (e.g., faster, more reliable) connection with the base station 1010, for example, at a 3.5 GHz frequency in the 5G NR band. Accordingly, the system 1000 may enhance existing communication links in providing additional connections to devices that may utilize or demand such links, such that input data is mixed with coefficient data to generate output data utilizing processing units; for example, output data to be transmitted in both the 4GE LTE and 5G NR bands. In some examples, drone 1017 may serve as a movable or aerial base station.

Like the signals transmitted to/from vehicles 1040 and 1045 that may experience a time-varying wireless channel due to time-varying objects in the paths of signals to/from vehicles 1040 and 1045, multiple drones 1017 may also experience such time-varying effects (e.g., in a drone network). Advantageously, utilizing the processing units 112 depicted in FIGS. 2A-2C, the time-varying nature of moving aerial objects can be better estimated by inferential recurrent neural networks that are trained to process RF signals in such time-varying wireless channels. For example, when receiving noisy wireless input data and mixing such input data with delayed versions of processing results, multiple drones 1017 may more efficiently process and compensate the effects of time-varying objects in their respective aerial paths, including on different frequency bands, e.g., in the case of multiple wireless connections for a single drone 1017, as described above.

The wireless communications system 1000 may include devices such as base station 1010, communication device 1020, and small cell 1030 that may support several connections at varying frequencies to devices in the system 1000, such that input data is mixed with coefficient data to generate output data utilizing processing units implemented in the electronic devices of system 1000, such as the processing units 112 of FIG. 1A, 2A, 2B or 2C. Such devices may operate in a hierarchal mode or an ad-hoc mode with other devices in the network of system 1000. While described in the context of a base station 1010, communication device 1020, and small cell 1030, it can be appreciated that other devices that can support several connections with devices in the network, such that input data is mixed with coefficient data to generate output data utilizing processing units 112, may be included in system 1000, including but not limited to: macrocells, femtocells, routers, satellites, and RFID detectors.

In various examples, the elements of wireless communication system 1000, such as base station 1010, a mobile device 1015, a drone 1017, communication device 1020 a small cell 1030, and vehicles 1040, 1045, may be implemented as an electronic device described herein that mix input data with coefficient data to generate output data utilizing processing units 112. For example, the communication device 1020 may be implemented as electronic devices described herein, such as electronic device 110 of FIG. 1A, implementing the processing units 112 of FIG. 2A, 2B, or 2C, or any system or combination of the systems depicted in the Figures described herein.

Figure 11:
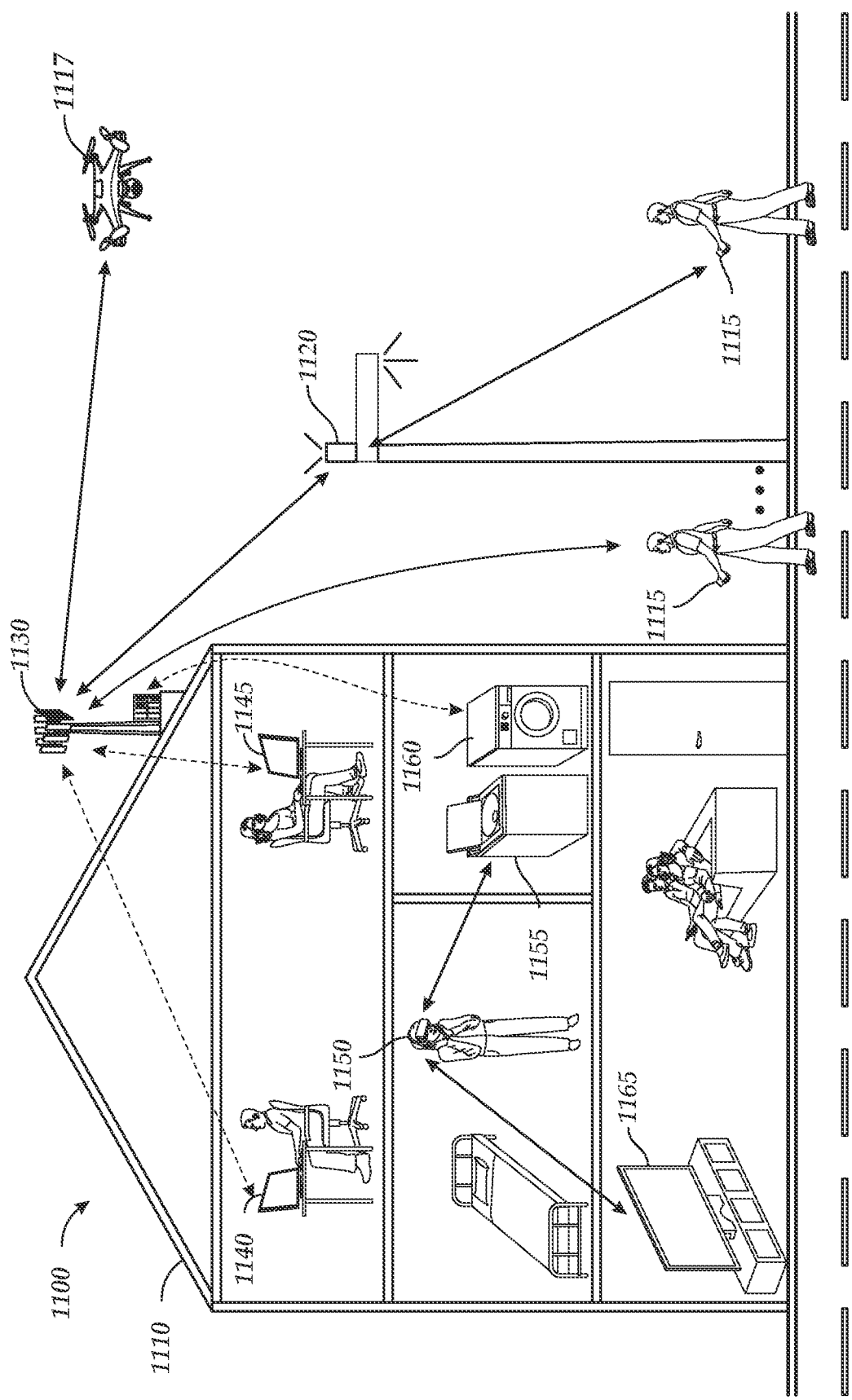
FIG. 11 is a schematic illustration of another wireless communications system arranged in accordance with aspects of the present disclosure.

FIG. 11 illustrates an example of a wireless communications device 1100 in accordance with aspects of the present disclosure. The wireless communications device 1100 includes a mobile device 1115, a drone 1117, a communication device 1120, and a small cell 1130. A building 1110 also includes devices of the wireless communication device 1100 that may be configured to communicate with other elements in the building 1110 or the small cell 1130. The building 1110 includes networked workstations 1140, 1145, virtual reality device 1150, IoT devices 1155, 1160, and networked entertainment device 1065. In the depicted device 1100, IoT devices 1155, 1160 may be a washer and dryer, respectively, for residential use, being controlled by the virtual reality device 1150. Accordingly, while the user of the virtual reality device 1150 may be in different room of the building 1110, the user may control an operation of the IoT device 1155, such as configuring a washing machine setting. Virtual reality device 1150 may also control the networked entertainment device 1065. For example, virtual reality device 1150 may broadcast a virtual game being played by a user of the virtual reality device 1150 onto a display of the networked entertainment device 1065.

Like the signals transmitted to/from vehicles 1040 and 1045 that may experience a time-varying wireless channel due to time-varying objects in the paths of signals to/from vehicles 1040 and 1045, a user of the virtual reality device 1150 may also experience such time-varying effects in the building 1110. Advantageously, utilizing the processing units 112 depicted in FIGS. 2A-2C, the time-varying nature of moving persons or objects can be better estimated by inferential recurrent neural networks that are trained to process RF signals in such time-varying wireless channels. For example, when receiving noisy wireless input data and mixing such input data with delayed versions of processing results, the virtual reality device 1150 may more efficiently process and compensate the effects of time-varying objects (e.g., a networked IoT device such as a robot vacuum device) or persons (e.g., other individuals in the room above or below the user of the virtual reality device 1150) in the building 1110.

The small cell 1130 or any of the devices of building 1110 may be connected to a network that provides access to the Internet and traditional communication links. Like the system 1000, the device 1100 may facilitate a wide-range of wireless communications connections in a 5G system that may include various frequency bands, including but not limited to: a sub-6 GHz band (e.g., 700 MHz communication frequency), mid-range communication bands (e.g., 2.4 GHz), and mmWave bands (e.g., 24 GHz). Additionally or alternatively, the wireless communications connections may support various modulation schemes as described above with reference to system 1000. Device 1100 may operate and be configured to communicate analogously to system 1000. Accordingly, similarly numbered elements of device 1100 and system 1000 may be configured in an analogous way, such as communication device(s) 1020 to communication device 1120, small cell 1030 to small cell 1130, etc.

Like the system 1000, where elements of system 1000 are configured to form independent hierarchal or ad-hoc networks, communication device 1120 may form a hierarchal network with small cell 1130 and mobile device 1115, while an additional ad-hoc network may be formed among the small cell 1130 network that includes drone 1117 and some of the devices of the building 1110, such as networked workstations 1140, 1145 and IoT devices 1155, 1160.

Devices in communication device 1100 may also form (D2D) connections with other mobile devices or other elements of the device 1100. For example, the virtual reality device 1150 may form a narrowband IoT connections with other devices, including IoT device 1155 and networked entertainment device 1065. As described above, in some examples, D2D connections may be made using licensed spectrum bands, and such connections may be managed by a cellular network or service provider. Accordingly, while the above example was described in the context of a narrowband IoT, it can be appreciated that other device-to-device connections may be utilized by virtual reality device 1150.

In various examples, the elements of wireless communication device 1100, such as the mobile device 1115, the drone 1117, the communication device 1120, and the small cell 1130, the networked workstations 1140, 1145, the virtual reality device 1150, the IoT devices 1155, 1160, and the networked entertainment device 1065, may be implemented as electronic devices described herein that mix input data with coefficient data to generate output data utilizing processing units 112. For example, the communication device 1120 may be implemented as electronic devices described herein, such as electronic device 110 of FIG. 1A, implementing the processing units 112 of FIG. 2A, 2B, or 2C, or 2C, or any system or combination of the systems depicted in the Figures described herein.

Certain details are set forth above to provide a sufficient understanding of described examples. However, it will be clear to one skilled in the art that examples may be practiced without various of these particular details. The description herein, in connection with the appended drawings, describes example configurations and does not represent all the examples that may be implemented or that are within the scope of the claims. The terms "exemplary" and "example" as may be used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Techniques described herein may be used for various wireless communications systems, which may include multiple access cellular communication systems, and which may employ code division multiple access (CDMA), time division multiple access (TDMA), frequency division multiple access (FDMA), orthogonal frequency division multiple access (OFDMA), or single carrier frequency division multiple access (SC-FDMA), or any a combination of such techniques. Some of these techniques have been adopted in or relate to standardized wireless communication protocols by organizations such as Third Generation Partnership Project (3GPP), Third Generation Partnership Project 2 (3GPP2) and IEEE. These wireless standards include Ultra Mobile Broadband (UMB), Universal Mobile Telecommunications System (UMTS), Long Term Evolution (LTE), LTE-Advanced (LTE-A), LTE-A Pro, New Radio (NR), IEEE 802.11 (WiFi), and IEEE 802.16 (WiMAX), among others.

The terms "5G" or "5G communications system" may refer to systems that operate according to standardized protocols developed or discussed after, for example, LTE Releases 13 or 14 or WiMAX 802.16e-2005 by their respective sponsoring organizations. The features described herein may be employed in systems configured according to other generations of wireless communication systems, including those configured according to the standards described above.

The various illustrative blocks and modules described in connection with the disclosure herein may be implemented or performed with a general-purpose processor, a digital signal processor (DSP), an application-specific integrated circuit (ASIC), a field-programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), or optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above are also included within the scope of computer-readable media.

Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing it will be appreciated that, although specific examples have been described herein for purposes of illustration, various modifications may be made while remaining with the scope of the claimed technology. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method comprising:
calculating, using at least one layer of multiplication/accumulation processing (MAC) units, input data and delayed data to generate results for another layer of MAC units, the another layer of MAC units different than the at least one layer of MAC units;
providing output data based at least in part on the results; and
transmitting the output data via at least one antenna according to a wireless protocol.

2. The method of claim 1, wherein the output data is representative of the input data being processed according to an aspect of the wireless protocol.

3. The method of claim 2, wherein transmitting the output data comprises transmitting the output data in accordance with the wireless protocol.

4. The method of claim 1, wherein the calculating further comprises:
providing the delayed data as input to the at least one layer of MAC units; and
multiplying the delayed data with the input data to generate multiplication processing results.

5. The method of claim 4, wherein the calculating further comprises:
storing, at one or more memory look-up units (MLU units) of a plurality of MLU units, the multiplication processing results;
retrieving, at the one or more MLU units of the plurality of MLU units, the multiplication processing results and a plurality of coefficients; and
generating the processing results based on the multiplication processing results and the plurality of coefficients.

6. An apparatus comprising:
a plurality of transmission devices configured to transmit sensor data, wherein the plurality of transmission devices are configured to transmit the sensor data in accordance with a wireless communication protocol; and
a receiver configured to receive narrowband transmissions from the plurality of transmission devices and configured to process the narrowband transmissions using a plurality of multiplication-accumulation (MAC) units and a plurality of delay units that are configured to generate output data based on the narrowband transmissions and delayed versions of the narrowband transmissions, wherein the output data is representative of the narrowband transmissions being processed in accordance with an aspect of the wireless communication protocol.

7. The apparatus of claim 6, wherein the narrowband transmission are narrowband Internet of Thing (IoT) transmissions.

8. An apparatus comprising:
a plurality of transmission devices configured to transmit sensor data; and
a receiver configured to receive narrowband transmissions from the plurality of transmission devices and configured to process the narrowband transmissions using a plurality of multiplication-accumulation (MAC) units and a plurality of delay units that are configured to generate output data based on the narrowband transmissions and delayed versions of the narrowband transmissions, wherein one or more delay units of the plurality of delay units is configured to introduce one or more time delays to the narrowband transmissions.

9. An apparatus comprising:
a plurality of transmission devices configured to transmit sensor data; and
a receiver configured to receive narrowband transmissions from the plurality of transmission devices and configured to process the narrowband transmissions using a plurality of multiplication-accumulation (MAC) units and a plurality of delay units that are configured to generate output data based on the narrowband transmissions and delayed versions of the narrowband transmissions, wherein the narrowband transmission are narrowband Internet of Thing (IoT) transmissions, and wherein one or more delay units of the plurality of delay units that are coupled to one or more MAC units, in at least one layer of MAC units, are configured to introduce a same time delay.

10. An apparatus comprising:
a plurality of transmission devices configured to transmit sensor data; and
a receiver configured to receive narrowband transmissions from the plurality of transmission devices and configured to process the narrowband transmissions using a plurality of multiplication-accumulation (MAC) units and a plurality of delay units that are configured to generate output data based on the narrowband transmissions and delayed versions of the narrowband transmissions, wherein processing the narrowband transmissions using the plurality of MAC units and a plurality of delay units comprises:
multiplying at least a portion of the narrowband transmissions with a corresponding portion of delayed versions of the narrowband transmissions to generate a respective coefficient multiplication result;
accumulating the respective coefficient multiplication result with one or more of the other respective coefficient multiplication results to provide a respective processing result to a respective memory look-up units (MLU units) of a plurality of MLU units; and
applying, at one or more MLUs of the plurality of MLU units, one or more coefficients to the processing results to generate the output data.

11. The apparatus of claim 10, wherein the plurality of MAC units, the plurality of delay units, and the plurality of MLU units form a recurrent neural network.

12. An apparatus comprising:
a radio frequency (RF) antenna configured to receive an RF wireless transmission comprising input data;
a recurrent neural network comprising a plurality of multiplication/accumulation (MAC) processing units, a plurality of delay units, and a plurality of memory look-up units (MLU units); and
non-transitory computer readable media encoded with executable instructions which, when executed by at least one processing unit, is configured to cause the apparatus to perform operations comprising:
implementing a wireless receiver processing mode;
mixing input data at the at least one processing unit using a plurality of coefficients, wherein mixing the input data comprises:

obtaining the plurality of coefficients based on the implemented wireless receiver processing mode; and calculating the input data and delayed versions of the input data with a portion of the plurality of coefficients to generate a plurality of processing results; and providing output data based partly on the plurality of processing results.

13. The apparatus of claim 12, wherein the obtaining is from at least a portion of the plurality of memory look-up units, wherein the calculating is performed using at least a portion of the MAC processing units, and wherein the providing is to a mobile application of the apparatus.

14. The apparatus of claim 12, wherein implementing the wireless receiving processing mode is based on a processing mode selection corresponding to the wireless receiver processing mode.

15. An apparatus comprising:

non-transitory computer readable media encoded with executable instructions which, when executed by at least one processing unit, is configured to cause the apparatus to perform operations comprising:

implementing a wireless receiver processing mode;

mixing input data at the at least one processing unit using a plurality of coefficients, wherein mixing the input data comprises:

obtaining the plurality of coefficients based on the implemented wireless receiver processing mode; and calculating the input data and delayed versions of the input data with a portion of the plurality of coefficients to generate a plurality of processing results; and providing output data based partly on the plurality of processing results; and memory look-up units (MLUs) configured to provide respective processing results of the plurality of processing results, wherein a portion of the plurality of the MLUs are configured to provide output data based at least in part on respective converted signals being mixed using the plurality of coefficients.

16. The apparatus of claim 15, wherein at least one delay unit of a plurality of delay units is coupled to a respective MLU unit of the portion of the plurality of the MLUs and configured to provide the delayed versions of input data.

* * * * *